United States Patent
Morimoto et al.

(10) Patent No.: US 9,804,508 B2
(45) Date of Patent: Oct. 31, 2017

(54) LINEAR MOTOR, STAGE APPARATUS, AND EXPOSURE APPARATUS

(75) Inventors: Shigeru Morimoto, Komagaya (JP); Tadahiro Kominami, Fukaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/664,416

(22) PCT Filed: Sep. 30, 2005

(86) PCT No.: PCT/JP2005/018167
§ 371 (c)(1),
(2), (4) Date: Apr. 4, 2008

(87) PCT Pub. No.: WO2006/038563
PCT Pub. Date: Apr. 13, 2006

(65) Prior Publication Data
US 2008/0212042 A1    Sep. 4, 2008

(30) Foreign Application Priority Data
Oct. 1, 2004   (JP) .............................. P2004-289924

(51) Int. Cl.
*G03B 27/58* (2006.01)
*G03B 27/62* (2006.01)
(Continued)

(52) U.S. Cl.
CPC ...... *G03F 7/70758* (2013.01); *G03F 7/70858* (2013.01); *H02K 41/031* (2013.01);
(Continued)

(58) Field of Classification Search
CPC ...... H02K 2201/18; H02K 16/00; H02K 3/24; H02K 3/44; H02K 3/46; H02K 3/47;
(Continued)

(56) References Cited

U.S. PATENT DOCUMENTS 4,937,485 A * 6/1990 Mihalko ..................... 310/208
5,534,970 A   7/1996 Nakashima et al.
(Continued)

FOREIGN PATENT DOCUMENTS

EP   1758231 A1   2/2007
JP   01-127379 U  8/1989
(Continued)

OTHER PUBLICATIONS

Office Action from related Chinese patent application No. 200580032810.4.
(Continued)

*Primary Examiner* — Christina Riddle
(74) *Attorney, Agent, or Firm* — Shapiro, Gabor and Rosenberger, PLLC

(57) ABSTRACT

A linear motor with high heat recovery efficiency that inhibits the rise in surface temperature is offered. The linear motor is disposed in a surrounding member (142) and facing a flow passage (142a) of a liquid for regulating temperature, and is provided with a coil unit (141) having at least a part thereof in contact with the liquid. The coil unit (141) is provided with a coil body (144), a mold layer (143) that covers the coil body and holds it in specific form, and a liquid protection layer (150) that covers the mold layer (143) and has liquid protection properties.

57 Claims, 11 Drawing Sheets

(51) Int. Cl.

| | |
|---|---|
| *G03B 27/32* | (2006.01) |
| *G03F 7/20* | (2006.01) |
| *H02K 41/03* | (2006.01) |
| G03B 27/52 | (2006.01) |
| H02K 9/19 | (2006.01) |
| H02K 9/22 | (2006.01) |
| H02K 3/47 | (2006.01) |
| H02K 16/00 | (2006.01) |

(52) U.S. Cl.
CPC ............. *H02K 3/47* (2013.01); *H02K 9/19* (2013.01); *H02K 9/22* (2013.01); *H02K 16/00* (2013.01); *H02K 2201/18* (2013.01)

(58) Field of Classification Search
CPC ............. H02K 41/031; G03F 7/70758; G03F 7/70716; G03F 7/70725; G03F 7/70858; G03F 7/70875
USPC ........ 355/30, 53, 75, 72–77; 310/10, 12, 16, 310/12.01, 12.05, 12.06, 12.23, 12.29, 310/12.32, 12.33, 52–54, 58, 64–65
See application file for complete search history.

(56) References Cited

U.S. PATENT DOCUMENTS

| | | | | |
|---|---|---|---|---|
| 5,731,643 | A | * | 3/1998 | Avakian et al. ............... 310/53 |
| 5,770,899 | A | * | 6/1998 | Hayashi ........................ 310/12 |
| 5,783,877 | A | * | 7/1998 | Chitayat ........................ 310/12 |
| 5,969,441 | A | | 10/1999 | Loopstra et al. |
| 5,998,889 | A | * | 12/1999 | Novak ....................... 310/12.29 |
| 6,084,319 | A | | 7/2000 | Kamata et al. ................ 310/12 |
| 6,114,781 | A | * | 9/2000 | Hazelton et al. ............... 310/12 |
| 6,208,407 | B1 | | 3/2001 | Loopstra |
| 6,341,007 | B1 | | 1/2002 | Nishi et al. |
| 6,400,441 | B1 | | 6/2002 | Nishi et al. |
| 6,549,269 | B1 | | 4/2003 | Nishi et al. |
| 6,590,634 | B1 | | 7/2003 | Nishi et al. |
| 6,721,034 | B1 | * | 4/2004 | Horikawa ...................... 355/53 |
| 7,038,759 | B2 | | 5/2006 | Emoto et al. |
| 7,057,703 | B2 | | 6/2006 | Emoto et al. |
| 2001/0005166 | A1 | * | 6/2001 | Coulombier ............ H01F 7/128 336/90 |
| 2002/0047314 | A1 | * | 4/2002 | Takedomi ...................... 310/12 |
| 2002/0079127 | A1 | * | 6/2002 | Miyakawa et al. ......... 174/110 R |
| 2002/0081528 | A1 | * | 6/2002 | Miyajima et al. ............. 430/302 |
| 2003/0155818 | A1 | * | 8/2003 | Koyanagawa et al. ......... 310/12 |
| 2004/0080217 | A1 | | 4/2004 | Ota et al. |
| 2007/0252444 | A1 | * | 11/2007 | Sadakane et al. ............. 310/12 |
| 2007/0252445 | A1 | * | 11/2007 | Shinohira et al. ............. 310/12 |
| 2008/0265691 | A1 | * | 10/2008 | Shikayama et al. ........... 310/12 |

FOREIGN PATENT DOCUMENTS

| | | | | |
|---|---|---|---|---|
| JP | 03150238 | A | * 6/1991 | ............ C03C 17/34 |
| JP | 06-349701 | A | 12/1994 | |
| JP | 08-166475 | A | 6/1996 | |
| JP | 08-330224 | A | 12/1996 | |
| JP | 10-163099 | A | 6/1998 | |
| JP | 10-214783 | A | 11/1998 | |
| JP | 2000-505958 | T | 5/2000 | |
| JP | 2001-237117 | A | 8/2001 | |
| JP | 2002320374 | A | * 10/2002 | |
| JP | 2003-045712 | | 2/2003 | |
| JP | 2003-086486 | A | 3/2003 | |
| JP | 2003-151819 | A | 5/2003 | |
| JP | 2003151819 | A | * 5/2003 | |
| JP | A-2003-151819 | | 5/2003 | |
| JP | 2004-254494 | A | 9/2004 | |
| JP | 2005-020871 | A | 1/2005 | |

OTHER PUBLICATIONS

Notice of Allowance issued on the counterpart Japanese Patent Application No. 2006-539269 on May 17, 2011.

Office Action issued Dec. 12, 2011 in Korean Patent Application No. 10-2007-7004817.

Office Action issued in Chinese Patent Application No. 2005800328104, dated Nov. 6, 2009.

Office Action dated Nov. 6, 2009, in Chinese Patent Application No. 2005800328104.

Office Action dated Apr. 13, 2010, in Chinese Patent Application No. 2005800328104.

Extended European search report (including supplementary European search report and search opinion) from European Patent Application No. 05787500.7, dated Oct. 7, 2016.

* cited by examiner

LINEAR MOTOR, STAGE APPARATUS, AND EXPOSURE APPARATUS

TECHNICAL FIELD

The present invention relates to linear motor provided with a coolant coil unit, stage apparatus used as a drive device for this linear motor, and exposure apparatus for projecting the mask pattern on to a substrate using a moving stage for driving the linear motor.

This application claims priority to Japanese Patent Application No. 2004-289924, filed Oct. 1, 2004, the contents of which are incorporated herein by reference.

BACKGROUND ART

For example, a linear motor is frequently used in an exposure apparatus used in the production of semiconductor elements, liquid-crystal display elements and the like, as a drive device that can drive without contact a reticle stage wherein a mask (reticle and the like) is placed and held, or a wafer stage wherein a photosensitive substrate (wafer, substrate and the like) is placed and held. Although heat-releasing coil body is used in this kind of linear motor when current is passed, generally, the exposure apparatus is used under environments wherein the temperate is controlled to a steady value. Thus, the heat release is anticipated to be inhibited in this linear motor also. For example, the heat release from the linear motor may cause thermal deformation in the surrounding members and devices, and may vary the air temperature in the light path of an interferometer used for detecting the stage position, and cause errors in the measured values.

The coil body was housed in a cooling jacket, and a temperature regulating medium (coolant) was made to flow through the jacket, thereby disclosing the technology for absorbing heat generated in the coil body (for example, refer to patent document 1). This patent document 1 also discloses technology using pure water as the coolant.

[Patent Document 1] Japanese Unexamined Patent Application, First Publication No. 2003-86486.

DISCLOSURE OF INVENTION

Problems to be Solved by the Invention

However, the problems such as the following exist in the prior art mentioned above:

Stage driving necessitates high speed and high acceleration, but as acceleration proceeds, there is concern that the cooling ability may not keep pace with the high acceleration. To cope with this high acceleration, active coolants such as water with high heat absorption characteristics may be considered. However, if a molded structure is formed using an economical insulating resin with good workability such as epoxy resin, and if the coil body surface is protected, electric insulating properties cannot be assured because epoxy resin does not possess water resistance.

To resolve this problem, a mold made of thermo-setting resin such as polyurethane, which does not hydrolyze easily may be considered for covering and molding the coil body. However, the molding temperature due to thermo-setting resin is higher than the heat-resistant temperature of the fusing layer for retaining the shape of the coil body; therefore, the problem of destruction of the fusing layer occurs. In view of these reasons, there was no option but to use inert coolants in the past. If the heat recovery efficiency when driving the motor is inadequate, the surface temperature rises, leading to measurement error in the interferometer mentioned above or thermal deformation of the surrounding members and devices.

The present invention has the object of offering linear motor, stage apparatus and exposure apparatus provided with this linear motor having high heat recovery efficiency and capable of inhibiting the rise in surface temperature.

Means for Solving the Problem

To achieve the object mentioned above, the present invention makes use of the mechanisms described below corresponding to FIG. 1 to FIG. 12 that show the embodiments.

The linear motor of the present invention is disposed in a surrounding member (142) and facing a flow passage (142*a*) of a fluid for regulating temperature, and is a linear motor (79) provided with at least a part thereof having liquid in contact with a coil unit (141). The coil unit (141) is provided with a coil body (144), a mold layer (143) that covers the coil body (144) and retains a specific form thereof, and a liquid protection layer (150) that covers the mold layer (143) having liquid protection properties.

Consequently, the insulation properties of the coil body (144) are ensured even if an active coolant such as water, for example, is used as the liquid with high heat capacity and as the liquid regulating temperature in the linear motor of the present invention because of the waterproofing provided by the liquid protection layer (150). Also, since the mold layer (143) covers the coil body (144) and maintains it in specific form, even if the liquid protection layer (150) is formed by thermo-setting resin, the fusing layer of the coil body (144) is not destroyed, and it can be covered by the liquid protection layer (150). The rise in surface temperature can thus be inhibited by the recovery of heat generated in the coil unit (141) by a liquid with high heat capacity, and measurement errors of the interferometer and thermal deformation of surrounding members and devices can be prevented.

The stage apparatus of the present invention uses the linear motor (79) mentioned above, as the drive device.

Accordingly, even if the stage (RST) is to be driven by the linear motor (79) in the stage apparatus of the present invention, the heat generated for driving the motor can be absorbed effectively, and thus the thermal deformation of the surrounding members and devices, and the change in air temperature of the surroundings can be inhibited.

The exposure apparatus of the present invention is an exposure apparatus (10) that projects the pattern of the mask (R) retained in the mask stage (RST) on to the substrate (W) retained in the substrate stage (WST). The stage apparatus (12) mentioned above is used in at least either the mask stage (RST) or the substrate stage (WST).

Consequently, even when the mask (R) and the substrate (W) are moved via the mask stage (RST) and the substrate stage (WST) in the exposure apparatus of the present invention, the thermal deformation of the surrounding members and devices due to heat generated when driving the motor, and the change in air-temperature of the surroundings can be inhibited, and the transfer precision of pattern on to the substrate (W) can be enhanced.

To make the description of the present invention easier to understand, the description is presented with reference to reference numerals applied to drawings of embodiments. However, the present invention is not limited to those embodiments only.

Effects of the Invention

According to the present invention, active coolant with high heat absorption characteristics can be used while maintaining the electric insulating properties, even when the motor is driven with high thrust, the rise in the surface temperature of the coil unit can be inhibited. The result is that measurement errors of measuring instruments and thermal deformation of surrounding members and devices can be prevented according to the present invention.

DESCRIPTION OF THE REFERENCE SYMBOLS

R . . . RETICLE (MASK), RST . . . RETICLE STAGE (MASK STAGE), W . . . WAFER (SUBSTRATE), WST . . . WAFER STAGE (SUBSTRATE STAGE), 10 . . . PROJECTION EXPOSURE APPARATUS (EXPOSURE APPARATUS), 12 . . . RETICLE STAGE APPARATUS (STAGE APPARATUS), 79 . . . X-AXIS VOICE COIL MOTOR (LINEAR MOTOR), 140A, 140B . . . , COIL UNIT, 141 . . . COIL BODY, 142 . . . FRAME (SURROUNDING MEMBER), 142A . . . INTERNAL SPACE (FLOW PASSAGE), 143 . . . MOLD LAYER (MOLD LAYER), 150 . . . WATERPROOFING LAYER (LIQUID PROTECTION LAYER), 151 . . . THIN PLATING (MOLD LAYER), 170 . . . LEAD UNIT, 171 . . . WIRING.

BEST MODE FOR CARRYING OUT THE INVENTION

The embodiments of the linear motor and its production method, and the stage apparatus and exposure apparatus are described hereinafter referring to FIG. 1 to FIG. 12.

This embodiment is of a stage apparatus provided with projection exposure apparatus (scanning stepper) of the scanning exposure type formed by the step and scan method to which the present invention has been applied.

First Embodiment

Figure 1:
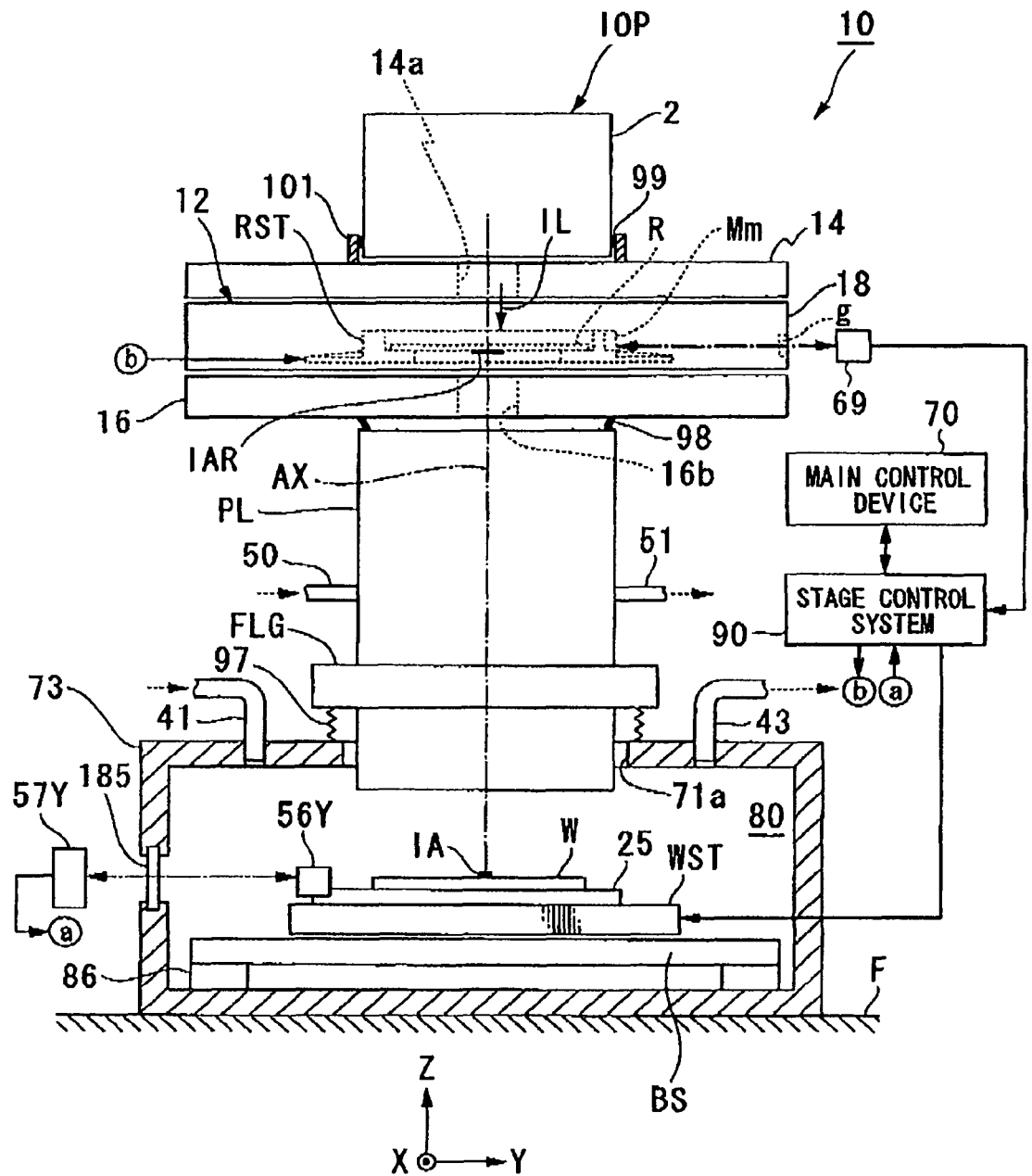
FIG. 1 shows a part indicating the schematic configuration of a projection exposure apparatus related to the present invention.

FIG. 1 shows the schematic configuration of the projection exposure apparatus (=exposure apparatus) 10 of the present embodiment. In FIG. 1, the Z axis is taken parallel to the optical axis AX of the projection optical system PL provided in the projection exposure apparatus 10, the Y axis is taken in the scanning direction of the reticle and wafer (described in detail hereafter) during scanning exposure in the plane perpendicular to the Z axis, and the X axis is taken in the non-scanning direction perpendicular to the scanning direction, for the purpose of explanations.

The projection exposure apparatus 10 of the present embodiment is provided with an illuminating optical system unit IOP, a reticle stage apparatus 12 used as a stage apparatus for driving the reticle R formed on a circuit pattern as a mask for a specific stroke in the Y direction and for fine driving it in the X direction, the Y direction and the θz direction (direction of rotation around the Z axis), a projection optical system PL, a wafer stage (substrate stage) WST for driving the wafer W as a substrate two-dimensionally in the X and Y directions in the XY plane, and their control systems and the like.

The illuminating optical system unit IOP includes an exposure light source and an illuminating optical system, and it illuminates the rectangular or circular-arc shaped illumination area IAR of the pattern face of the reticle R prescribed by the field stop (reticle blind) disposed inside it with uniform luminance distribution using the exposure light IL. An illumination system similar to the optical illuminating light system has been disclosed for example, in Japanese Unexamined Patent Application, First Publication No. H06-349701. Vacuum ultraviolet light such as ArF excimer laser light (wavelength 193 nm) or an $F_2$ laser light (wavelength 157 nm) may be used as the exposure light of the present embodiment. Deep ultraviolet light such as KrF excimer laser light (wavelength 248 nm), or bright lines of the ultraviolet region (g-rays, i-rays, and so on) from an extra-high pressure mercury lamp may also be used as the exposure light IL.

Next, the reticle stage apparatus 12 is disposed below the illumination system side plate (cap plate) 14 in FIG. 1 used as the plate having an annular fitting 101 connected to the bottom part of the illuminating optical system unit IOP. The illumination system side plate 14 is supported by the substantially horizontal supporting member (not shown in the figures). A rectangular hole 14a, which becomes the light path (passage) for the exposure light IL, is formed at almost its center.

As can be observed from FIG. 1 and FIG. 2, which is the perspective view of the reticle stage apparatus 12, the reticle stage apparatus 12 is provided with a reticle base 16 disposed almost parallel to and below the illumination system side plate 14 at a specific spacing as a table; a reticle stage RST disposed between this reticle base 16 and the illumination system side plate 14 as a slider, a frame member 18 disposed between the reticle base 16 surrounding the reticle stage RST and the illumination system side plate 14, and a reticle stage drive system that drives the reticle stage RST, and the like.

The reticle base 16 is supported substantially horizontally by a supporting member (not shown in the figures). As shown in FIG. 3, which is an exploded perspective view of FIG. 2, this reticle base 16 is formed by members of substantially plate form; nearly at its center, a recessed guide 16a is formed. The upper surface of this guide 16a (guide face) is finished to an extremely high level of flatness. A rectangular opening 16 b is formed at nearly the center of the guide 16a, oriented lengthwise in the X direction for passing through the exposure light IL in the Z direction. As shown in FIG. 1, the projection optical system PL matching the rectangular opening 16b is disposed on the side of the undersurface of the reticle base 16.

Figure 4A:
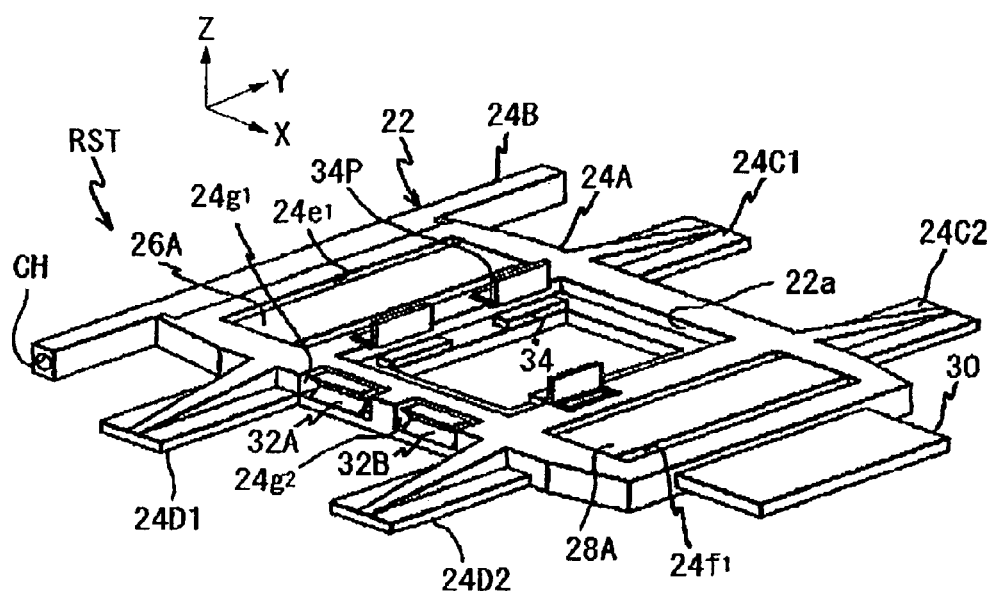
FIG. 4A is a perspective view showing the reticle stage of FIG. 1.

The reticle stage RST is provided with the reticle stage body 22 of special shape, as shown in FIG. 4A, and various kinds of magnet units (described in detail hereafter) fixed to this reticle stage body 22. The reticle stage body 22 is provided with a plate member of approximately rectangular shape when viewed from above, a mirror 24B installed at the end of the plate member in the X direction, and two pairs of extension parts 24C1, 24C2, 24D1, 24D2 protruding in the Y direction from the ends of each side in the Y direction of the plate member 24A.

At approximately the center of the plate member 24A, a stepped opening 22a is formed at the center of the opening that allows the exposure light IL to pass through. Multiple (for example, three) reticle supporting members 34 are installed to support the reticle R from multiple points (for example, three points) below the reticle R in the step (part that has been drilled down by one step) of the stepped opening 22a. Multiple (for example, three) reticle fixing mechanism 34P are installed in the plate member 24A for holding therebetween and fixing the reticle R corresponding to each reticle supporting member 34.

Figure 4B:
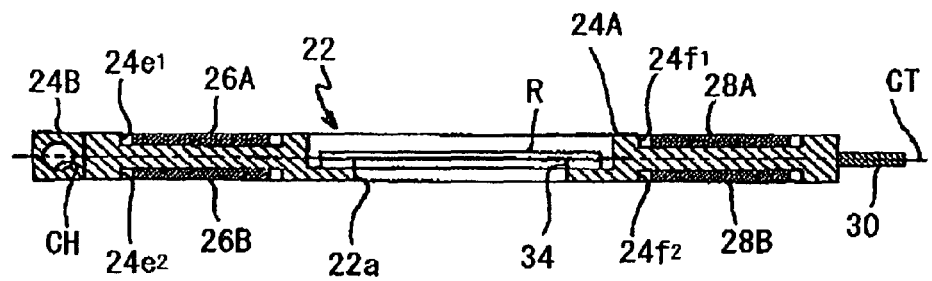
FIG. 4B is a cross section view of the reticle stage when viewed from the Y direction.

With the pattern face (lower face) approximately coinciding with the neutral surface CT (surface that does not contract or expand when bending moment is received) of the reticle stage body 22 (reticle stage RST), the reticle R is supported by multiple supporting members 34 (see FIG. 4B). Instead of, or together with the reticle supporting member 34 and the reticle fixing mechanism 34P, various kinds of chuck such as vacuum chuck or electrostatic chuck may be used.

As is evident from FIG. 4A and FIG. 4B, the mirror 24B has a substantially prismatic form, oriented lengthwise in the Y direction, and at its center, a hollow part CH of cylindrical cross section is formed for lightening the mirror. The end face in the X direction of the mirror 24B is a reflecting surface 124m (see FIG. 5) that has been mirror finished.

The reticle stage body 22 including the plate member 24A and the mirror 24B is integrally formed (for example, formed by machining a member), but in this embodiment, each part is treated as a separate member where necessary to simplify the explanations. Naturally, any one of the parts mentioned above may be formed with another using different member, or all may be formed using separate members.

Also, in FIG. 4A, two grooves 24g1, 24g2 are formed at the end of the plate member 24A of the reticle stage body 22 in the Y direction. Retro-reflectors 32A, 32B are provided in each of these grooves 24g1, 24g2 as moving mirrors. The four extension parts 24C1, 24C2, 24D1, 24D2 are in substantially plate form, and a reinforcement with triangular cross section is provided in each extension part for enhancing its strength. At the bottom face of the reticle stage body 22, a first differential exhaust type static pressure air bearing is formed in the Y direction extending all through from the extension part 24C1 to the extension part 24D1, and a second differential exhaust type static pressure air bearing is formed in the Y direction extending all through from the extension part 24C2 to the extension part 24D2.

Figure 6:
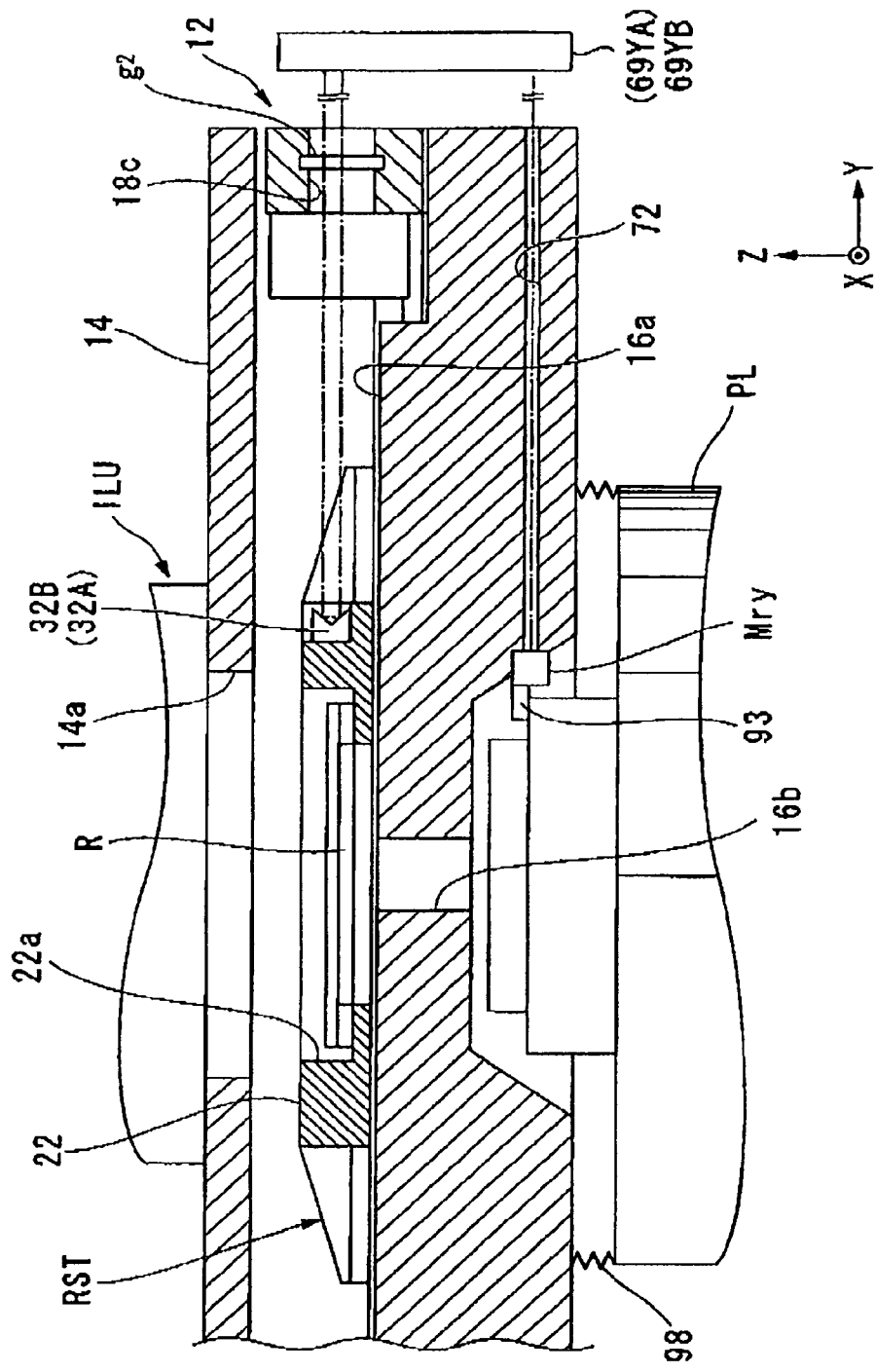
FIG. 6 is a cross section view of the illumination system side plate, the reticle stage, and the reticle base of FIG. 1 when viewed from the X direction.

As shown in FIG. 6, which is a cross section view of a part of the reticle stage apparatus 12 of FIG. 1, the reticle stage RST is held in a non-contact floating manner via a clearance of approximately several microns above the upper surface of the guide 16a by the balance between the static pressure of the pressurizing gas blown over the upper surface of the guide 16a of the reticle base 16 from the first and second differential exhaust type static pressure air bearings at the bottom surface of the reticle stage body 22 and the self-weight of the entire reticle stage RST.

Returning to FIG. 2, two overlapped substantially annular grooves 83, 85 are formed on the upper surface of the frame member 18. Multiple intake openings (not shown in the figures) are formed in the inner groove (hereinafter referred to as the "supply groove") 83, and multiple exhaust openings (not shown in the figures) are formed in the outer groove (hereinafter referred to as "exhaust groove") 85. The intake opening formed within the supply groove 83 is connected to the gas supply apparatus (not shown in the figures) via the supply pipe passage and supply piping (not shown in the figures). The exhaust opening formed within the exhaust groove 85 is connected to the vacuum pump (not shown in the figures) via the exhaust pipe passage and the exhaust piping (not shown in the figures).

Also, supply groove and exhaust groove (not shown in the figures), which are substantially annular grooves corresponding to the supply groove 83 and the exhaust groove 85 on the upper surface, are formed on the bottom surface of the frame member 18. These supply and exhaust grooves are also connected to the gas supply apparatus and the vacuum pump (not shown in the figures). Differential exhaust type static pressure air bearings are formed substantially to include the supply groove and the exhaust groove on the upper surface of the reticle base 16 to support the frame member 18 in a floating manner.

That is, when the gas supply apparatus and vacuum pump we in the operating condition, pressurizing gas is blown on the upper surface of the reticle base 16 from the supply groove (not shown in the figures) on the bottom surface of the frame member 18. The self-weight of the frame member 18 is supported by the static pressure of the pressurizing gas blown on the surface, and the frame member 18 is supported in a floating manner via a clearance of approximately several microns above the upper surface of the reticle base 16.

Similarly, the differential exhaust type static pressure air bearings are formed substantially to include the supply groove 83 and the exhaust groove 85 on the upper surface of the frame member 18 to maintain the clearance between the frame member 18 and the illumination system side plate 14.

That is, when the gas supply apparatus and the vacuum pump are in the operating condition, pressurizing gas is blown on the lower surface of the illumination system side plate 14 from the supply grove 83 formed on the upper surface of the frame member 18, and a specific clearance is maintained between the frame member 18 and the illumination system side plate 14 because of the balance between the static pressure of the pressurizing gas blown in and the vacuum suction force.

Figure 2:
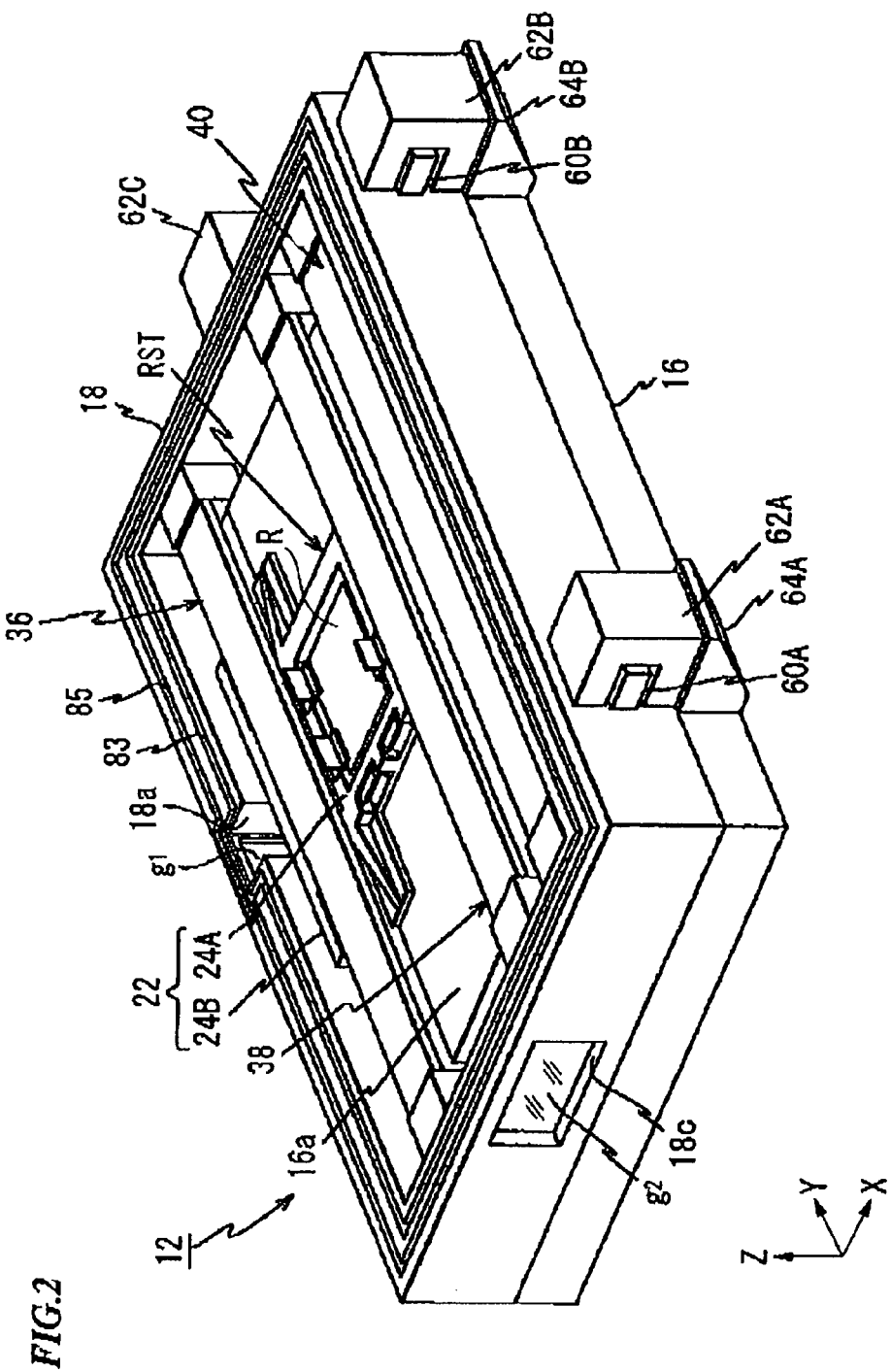
FIG. 2 is a perspective view showing the configuration of the frame member and the reticle stage of FIG. 1.
Figure 3:
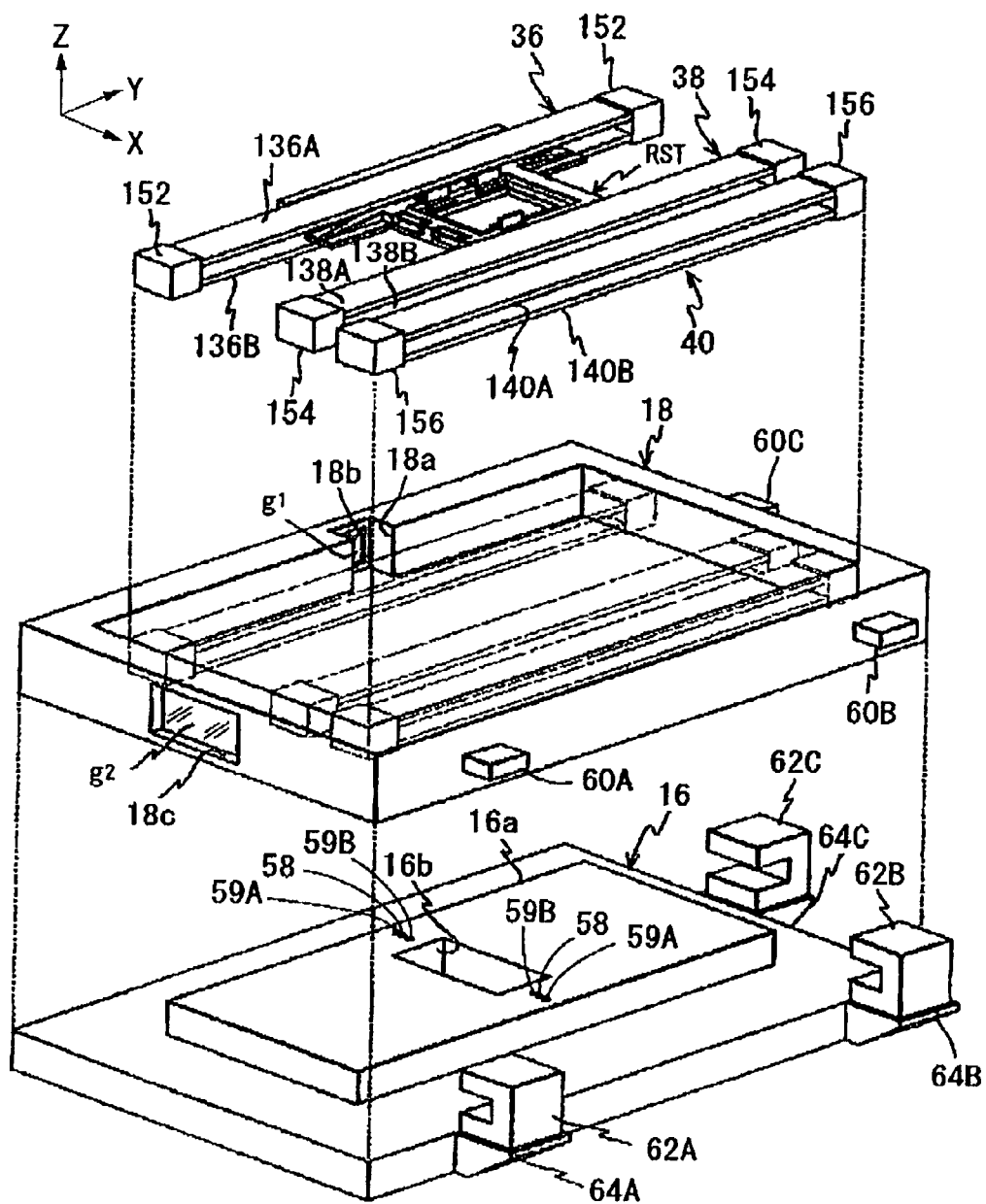
FIG. 3 is an exploded perspective view showing the configuration of the reticle stage, the frame member, and the reticle base.

Next, as shown in FIG. 2, the reticle stage drive system is provided with the first drive mechanism that drives the reticle stage RST in the Y direction and also finely drives it in the θz direction (direction of rotation around the Z axis), and the second drive mechanism that finely drives the reticle stage RST in the X direction. The first drive mechanism is provided with a pair of Y-axis drive units 36, 38 each of which is erected in the Y direction within the frame member 18 included in the drive mechanism. The second drive mechanism is provided with an X-drive unit 40 erected in the Y direction on the X direction side of the Y-axis drive unit 38 and on the +X direction side within the frame member 18 included in it.

As shown in the exploded perspective view in FIG. 3, one of the Y-axis drive units 36 is provided with stator units 136A, 136B each disposed with a pair of coil units the length direction of which is the Y direction, and a pair of fixing members 152 that retain either end of the stator units 136A, 136B in the Y direction (oriented lengthwise). In this case, the stator units 136A, 136B are disposed at a specific spacing in the Z direction (vertical direction) to face each other and are held parallel to each other in the XY plane by a pair of fixing members 152. Each of the pair of fixing members 152 is fixed to the inner wall face of the frame member 18.

Figure 5:
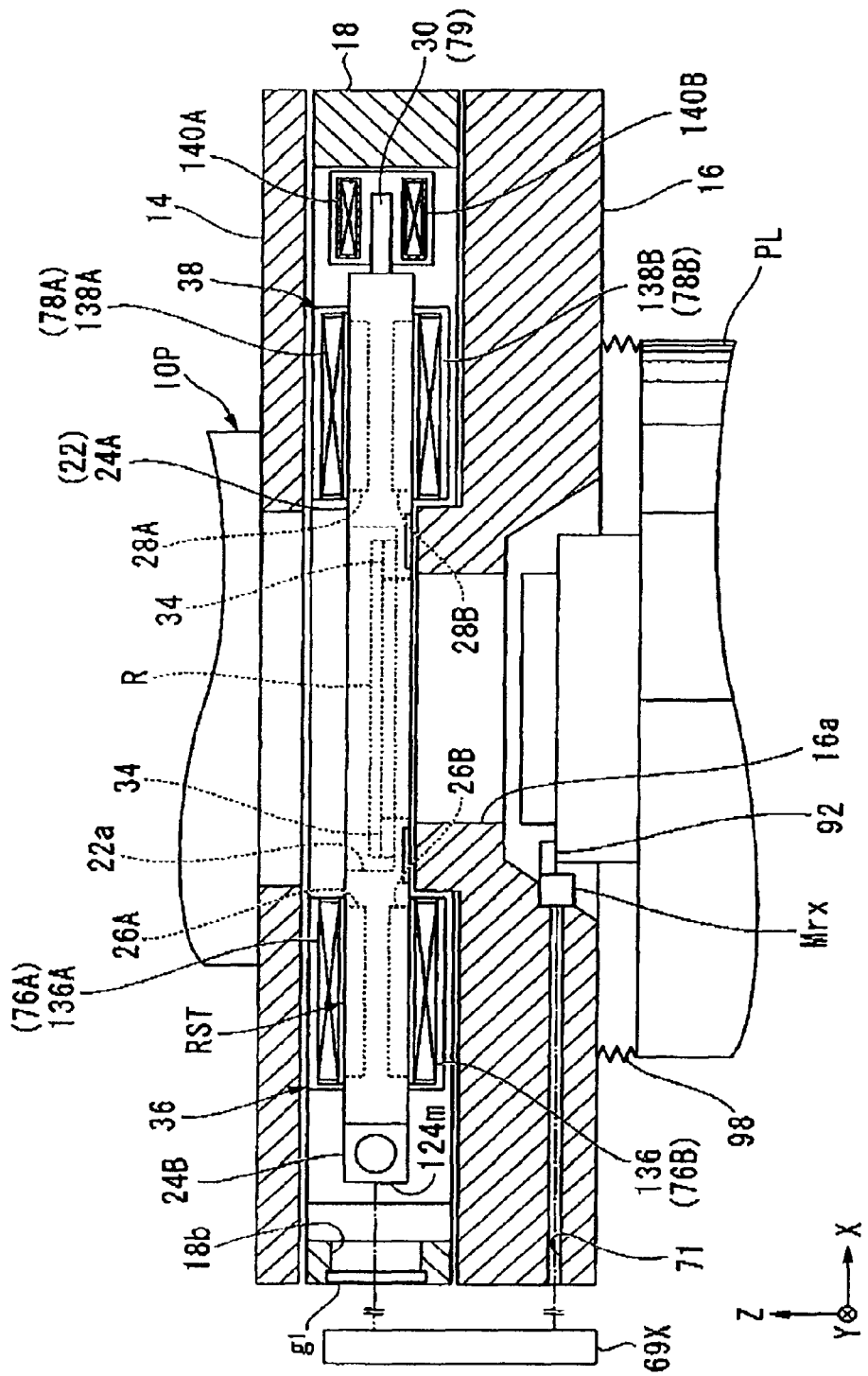
FIG. 5 is a cross section view of the illumination system side plate, the reticle stage, and the reticle base of FIG. 1 when viewed from the Y direction.

As can be observed from FIG. 5, the cross section view near the reticle stage body 22 of FIG. 3 and FIG. 1, the stator units 136A, 136B include a frame of rectangular cross section (oriented lengthwise) made of a non-magnetic material, wherein multiple coils are disposed at specific spacing in the Y direction. A coolant flows through the frame to cool the coils. Details of the coolant are given hereafter.

The Y-axis drive unit 38 on the +X direction side is also configured similar to the Y-axis drive unit 36. That is, the Y-axis drive unit 38 is provided with stator units 138A, 138B each disposed with a pair of coil units oriented lengthwise in the Y direction, and with a pair of fixing members 154 for fixing the two ends of the stator units 138A, 138B maintained at a specific spacing in the Z direction. Each of the pair of fixing members 154 is fixed to the inner wall face of the frame member 18. The stator units 138A, 138B are configured in a similar manner as the stator units 136A, 136B (refer to FIG. 5).

Also, the reticle stage RST is provided between the upper stator units 136A, 138A and the lower stator units 136B, 138B via a specific clearance, as shown in FIG. 5. In this case, moving piece units 26A, 26B are embedded in a pair of magnet units (magnetic pole units) each disposed on the upper surface and lower surface of the reticle stage RST and each facing the stator units 136A, 136B; The moving piece units 28A, 28B are embedded in a pair of magnet units each disposed on the upper surface and lower surface of the reticle stage RST, and each facing the stator units 138A, 138B. In the present embodiment, the moving piece units 26A, 26B and 28A, 28B are used as magnet units disposed in the Y direction with multiple permanent magnets that generate magnetic field in the Z direction at specific pitch while reversing polarity, but electromagnets and the like may be used instead of the permanent magnets.

As shown in FIG. 4B, each of the moving piece units 26A, 26B, is disposed in the X direction side of the stepped opening 22a of the plate member 24A of the reticle stage body 22, in the grooves 24e1, 24e2 formed on the upper and lower faces symmetrically about the neutral surface CT of the reticle stage body 22. In this case, the stator units 136A, 136B of FIG. 5 are positioned almost symmetrically about the neutral surface CT taken as the reference. Each unit in the pair of moving piece units 26A, 26B is provided with magnetic body member and multiple magnets disposed at a specific spacing in the Y direction on the surface of the magnetic body member. Adjacent magnets among the multiple magnets are disposed with opposite polarity. Accordingly, alternating magnetic field is formed in the Y direction in the space above the moving piece unit 26A and in the space below the moving piece unit 26B.

Similarly, as shown in FIG. 4B, each of the moving piece units 28A, 28B, is disposed in the +X direction side of the stepped opening 22a of the plate member 24A of the reticle stage body 22, in the grooves 24f1, 24f2 formed on the upper and lower faces symmetrically about the neutral surface CT of the reticle stage body 22. Also, each unit in the pair of moving piece units 28A, 28B, is disposed almost symmetrically to the left and right sides of the moving piece units 26A, 26B, with respect to a straight line parallel to the Z axis and passing through the central position (almost coinciding with the position of the center of gravity of the reticle stage RST in the X direction) in the X direction of the stepped opening 22a. Also, the first stator units 138A, 138B of FIG. 5 are positioned almost symmetrically about the neutral surface CT taken as the reference.

Each unit in the pair of moving piece units 28A, 28B is provided with magnetic body member and multiple magnets disposed at a specific spacing in the Y direction on the surface of the magnetic body member. Adjacent magnets among the multiple magnets are disposed with opposite polarity. Accordingly, alternating magnetic field is formed in the Y direction in the space above the moving piece unit 28A and also in the space below the moving piece unit 28B.

In this embodiment, the stator units 136A and 138A above the Y axis drive units 36 and 38, and the moving piece units 26A and 28A disposed to face each other on the side of the reticle stage body 22, form the first Y-axis linear motor 76A and the second Y-axis linear motor 78A respectively, as shown in FIG. 5. Also, the stator units 136B and 138B above the Y-axis drive units 36 and 38, and the corresponding moving piece units 26B and 28B disposed on the side of the reticle stage body 22, form the third Y-axis linear motor 76B and the fourth Y-axis linear motor 78B respectively, as shown in FIG. 5. The first, second, third and fourth Y-axis linear motors 76A, 78A, 76B, 78B form the first drive mechanism as single-axis drive devices. The Y-axis linear motors 76A, 78A, 76B, 78B for the four axes in this embodiment are moving magnet type motors. Since wiring need not be connected on the side of members that move with wide strokes, the moving speed should preferably be increased.

For instance, in the first Y-axis linear motor 76A, by supplying electric current in the X direction to the coil in the stator unit 136A as a stator, the electromagnetic interaction between the electric current flowing through the coil and the magnetic field generated in the Z direction by the magnets in the moving piece unit 26A as the moving piece generates electromagnetic force (Lorentz force) in the Y direction in the stator unit 136A, according to Fleming's left hand rule. This reaction (reaction force) of the electromagnetic force becomes the thrust driving the moving piece unit 26A in the Y direction relative to the stator unit 136A. Similarly, the second Y-axis linear motor 78A of FIG. 5 generates a thrust driving the moving piece unit 28A in the Y direction relative to the stator unit 138A. The third and fourth Y-axis linear motors 76B and 78B also generate the thrust to drive the moving piece units 26B and 28B in the Y direction relative to the stator units 136B and 138B respectively.

In this way, when the stators (stator units 136A, 138A, 136B, 138B) and the moving pieces (moving piece units 26A, 28A, 26B, 28B) perform physical interaction such as electromagnetic interaction and generate drive forces, the stators and the moving pieces may be considered as "operating associatively" and generating a drive force. In practice, the stator moves slightly in the opposite direction as the moving piece due to the electromagnetic force (action). For this reason, the member with relatively frequent movement is called moving piece or moving piece unit, and the member with relatively less frequent movement is called stator or stator unit in this specification.

In this case, the stator units 136A, 138A, 136B, 138B of the first, second, third and fourth Y-axis linear motors 76A, 78A, 76B, 78B are connected to the frame member 18 as the first member via the Y-axis drive units 36, 38, of FIG. 2. The moving piece units 26A, 28A, 26B, 28B are each fixed to the reticle stage RST (reticle stage body 22) as the second member of FIG. 2. Also, the first and second Y-axis linear motors 76A and 78A am disposed separately and almost symmetrically in the X direction so as to hold therebetween the reticle R, and each motor drives the reticle stage RST in the Y direction relative to the frame member 18.

Also, the third and fourth Y-axis linear motors 76B, 78B are disposed to face the first and second Y-axis linear motors 76A and 78A, and drive the reticle stage RST in the Y direction relative to the frame member 18.

Moreover in this present embodiment, the frame member 18 with the Y-axis drive units 36, 38 fixed thereof in FIG. 2 is supported without contact via air bearings between the reticle base 16 on the lower surface side and the illumination system side plate 14 on the upper surface side. For this reason, when the reticle stage RST is driven in the Y direction by the Y-axis linear motors 76A, 78A, 76B, 78B, the frame member 18 moves slightly in the opposite direction so as to cancel the reaction force. As a result, the occurrence of vibrations when driving the reticle stage RST is inhibited. However, the movement of the frame member 18 is slight because the mass of the frame member 18 relative to the mass of the reticle stage RST is very large.

According to the present embodiment, the first and third Y-axis linear motors 76A and 76B on the X-direction side in FIG. 5 are generally driven synchronously to generate the same thrust in the Y direction. Similarly, the second and fourth Y-axis linear motors 78A and 78B are also driven synchronously to generate the same thrust in the Y direction. When the reticle stage RST (reticle R) is to be driven at the same speed in the Y direction, the first and third Y-axis linear motors 76A, 76B, and the second and fourth Y-axis linear motors 78A, 78B are also operated synchronously, and they drive the reticle stage RST with almost equal thrust in the Y direction relative to the frame member 18. When the angle of rotation θz (yawing) of the reticle stage RST has to be corrected, the ratio of the magnitude of the thrust generated by the first and the third Y-axis linear motors 76A and 76B, and the thrust generated by the second and the fourth Y-axis linear motors 78A and 78B is controlled.

According to the present embodiment, as shown in FIG. 4B, the moving piece units 26A and 26B, and the moving piece units 28A and 28B are disposed symmetrically about the neutral surface CT of the reticle stage RST taken as the reference. The stator units 136A and 136B, and the stator units 138A and 138B of FIG. 5 corresponding to these moving piece units, are also disposed symmetrically above and below the neutral surface CT taken as the reference. For this reason, by supplying electric current corresponding to each coil in the stator units 136A, 136B, 138A, 138B, and by applying the same drive force to the moving piece units 26A, 26B, 28A, 28B, the drive force (sum of the drive forces of the moving piece units 26A, 26B, and the sum of the drive forces of the moving piece units 28A, 28B) can be applied in the Y direction at two locations above the neutral surface CT (see FIG. 4B) of the reticle stage RST. As a result, the application of pitching moment on the reticle stage RST is prevented as far as possible.

Furthermore, according to the present embodiment, the moving piece units 26A, 26B and the moving piece units 28A, 28B are also disposed almost symmetrically with respect to a position near the center of gravity of the reticle stage RST in the X direction. For this reason, since the drive force in the Y direction mentioned above acts at two equidistant locations in the X direction from the center of gravity of the reticle stage RST, the same force is generated at these two locations, and the total drive force in the Y direction can be applied at a position near the center of gravity of the reticle stage RST. Consequently, if the reticle stage body 22 is to be driven linearly in the Y direction, for example, yawing moment is prevented from acting on the reticle stage RST as far as possible.

Next, as shown in FIG. 3, the X-drive unit 40 on the side of the second drive mechanism is provided with stator units 140A, 140B as a pair of stators oriented lengthwise in the Y direction, and a pair of fixing members 156 that retain these stator units 140A, 140B at one end and the other end of the Y direction (oriented lengthwise). In this case, the stator units 140A, 140B are disposed at a specific spacing in the Z direction (vertical direction) to face each other and are held parallel to each other in the XY plane by a pair of fixing members 156. Each of the pair of fixing members 156 is fixed to the inner wall face of the frame member 18.

The stator units 140A, 140B have a rectangular cross section (oriented lengthwise) frame made of non-magnetic material, as shown in FIG. 5, wherein coil unit 141 is disposed.

Figure 7A:
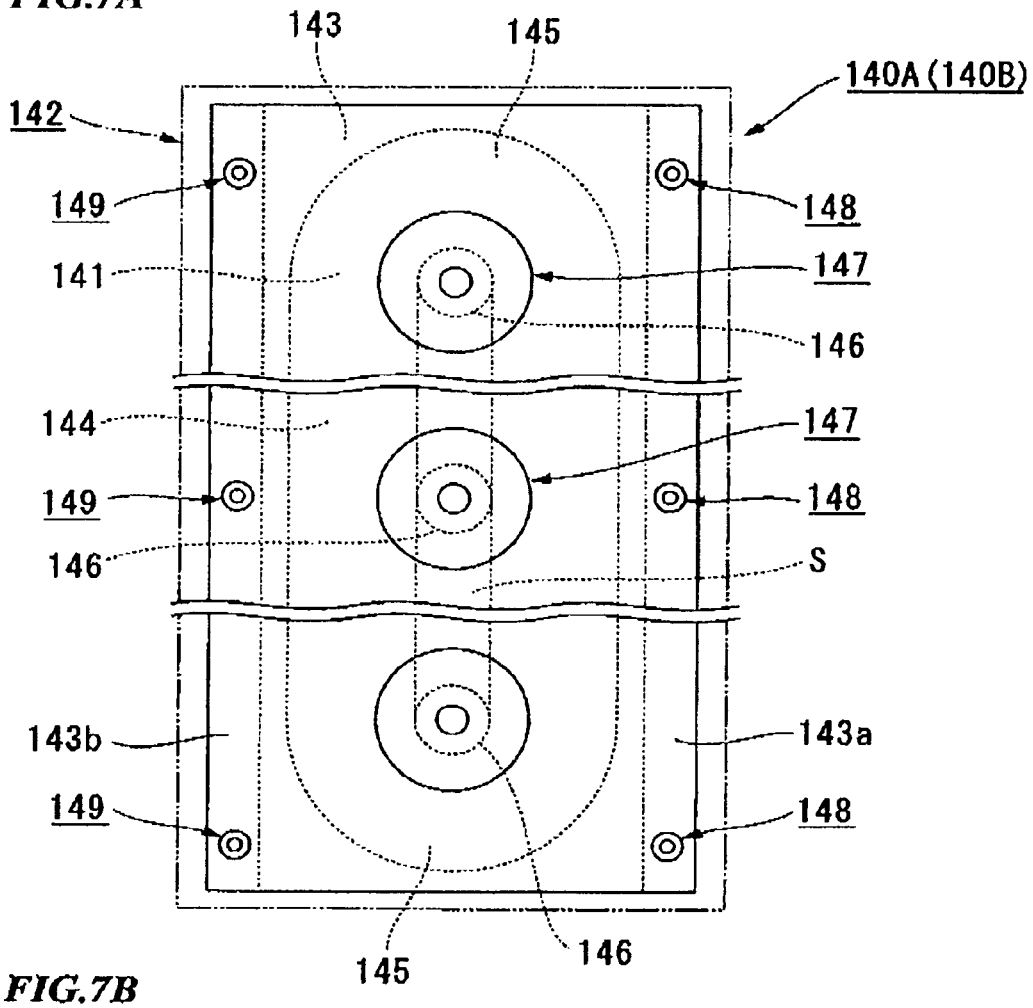
FIG. 7A is a plan view of the coil unit.
Figure 7B:
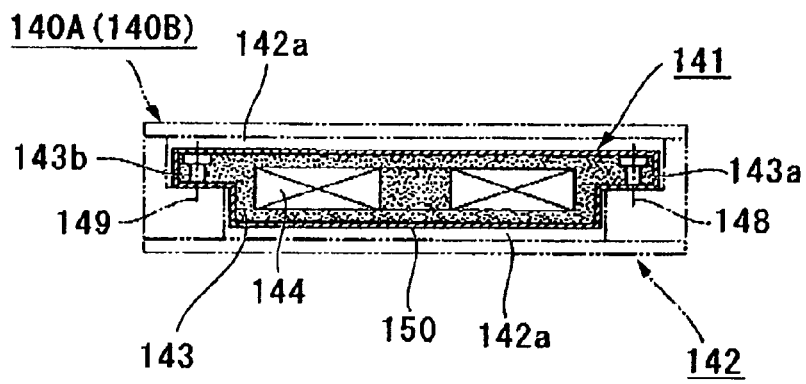
FIG. 7B is a front cross section view of the coil unit.

FIG. 7A is a plan view of the stator units 140A, 140B, while FIG. 7B is a front cross section view.

The coil unit 141 is housed in the internal space 142a of the frame 142 made of non-magnetic material. This internal space 142a is used as a flow passage for the temperature regulating coolant (liquid). The coil unit 141 is disposed considering the flow passage 142a; thus, the heat generated when current is passed through, is recovered by the coolant. Water with high cooling efficiency and high specific heat (especially pure water) and the like may be used as the coolant. For example, in addition to pure water, hydrofluorether (for example "Novec HFE": manufactured by Sumitomo 3M Limited), or fluorochemical inert fluid (for example, "Fluorinert": manufactured by Sumitomo 3M Limited) and the like, maybe be used as an inert fluid.

Flanges 143a, 143b for connecting to the frame 142 extend to the edges at the two sides of the coil unit 141. The coil unit 141 is integrally fixed to the frame 142 by tightening devices 148, 149 such as mounting bolts in the flanges 143a, 143b.

The coil unit 141 is provided mainly with a coil body 144, a mold layer (mold layer) 143 for covering and retaining the coil body 144 in shape, and a waterproofing layer (liquid protection layer) 150 covering the mold layer 143.

The coil body 144 is formed in substantial oval shape (elliptical shape) by winding wire such as copper wire. This coil body 144 is retained in shape by a fusing layer (not shown in the figures) formed by thermal bonding or alcohol bonding and the like, and its electric insulating properties with the surroundings are maintained by an insulating layer (not shown in the figures), such as polyimide or polyamide-imide.

A core member 146 for maintaining the shape of the coil body 144 is installed in the core of the coil body 144. The core member 146 in the present embodiment is formed using PPS resin. The wire wound as core during formation of the coil body 144 may be used as core member 146, it may be inserted after formation of the coil body 144. The core member 146 may be used to maintain the shape of the coil body 144, and it may also be used to fix the coil body 144 with respect to the frame 142 or to ensure the coolant flow passage 142*a*. The coil body 144 is described as being provided with the core member 146 in the present embodiment, but the coil body 144 need not necessarily be provided with the core member 146.

The mold layer 143 has good moldability and high temperature resistant-properties, and is made of a high temperature resistant epoxy resin, which is a synthetic resin having good affinity with the waterproofing layer 150. The mold layer 143 should have the function of inhibit deformation of the coil body 144, which may deform because of the thrust generated by the linear motor. Especially, when multiple coil bodies 144 are disposed and connected to form a single coil unit 141, the positional relationship between the coil bodies 144 should be maintained so as to resist the thrust. Moreover, it is also advantageous if the coil unit 141 does not deform and its form is maintained in a stable condition when the coil unit 141 is assembled with the frame 142. For this reason, a material with a specific rigidity after curing should be used as the material of the mold layer 143. High temperature epoxy resin is appropriate as a mold layer in respect of this point also.

The waterproofing layer 150 is made of a material having waterproofing ability against pure water, which is a coolant. Here, polyurethane resin is used as a coating (cover) on the surface of the mold layer 143. In this way, by using different materials applied for specific objectives such as the mold layer 143 for maintaining the form of the coil unit 141 and a waterproofing layer 150 for waterproofing it, the change in shape of the coil unit 141, that is, the coil body 144, which receives the thrust of the linear motor, is inhibited. The drive performance of the linear motor can be satisfactorily maintained, and pure water, which can cool the linear motor more efficiently as a coolant, can be used.

Returning to FIG. 5, a permanent magnet 30 of rectangular cross section oriented lengthwise) in plate form is disposed as a moving piece fixed at the end of the reticle stage RST in the +X direction to generate magnetic field in the Z direction, via a specific clearance between each of the stator units 140A, 140B. Instead of the permanent magnet 30, a magnet unit made of a magnetic body member and a pair of flat permanent magnets each fixed to the upper and lower face thereof may be used.

In this case, the permanent magnet 30 and the stator units 140A, 140B are disposed almost symmetrically about the neutral surface CT taken as reference (see FIG. 4B and FIG. 5). Consequently, electromagnetic force (Lorentz force) is generated in the X direction in the coil according to Fleming's left hand rule because of the electromagnetic interaction between the magnetic field in the Z direction formed by the permanent magnet 30 and the electric current flowing in the Y direction through the coils that form the stator units 140A, 140B, and the reaction to this electromagnetic force becomes the thrust that drives the permanent magnet 30 (reticle stage RST) in the X direction. In this case also, the frame member 18 moves slightly in a direction opposite to that of the reticle stage RST so as to cancel out the reaction when driving the reticle stage in the X direction. Accordingly, the occurrence of vibrations when driving the reticle stage RST in the X direction is inhibited.

In this case, drive force can be applied in the X direction at a position above the neutral surface CT (see FIG. 4B) of the reticle stage RST by supplying the same current to the coil body 144 that forms each of the stator units 140A, 140B. As a result, the application of rolling moment on the reticle stage RST is prevented as far as possible.

As described above, the stator units 140A, 140B and the permanent magnet 30 are used to form an X-axis voice coil motor (linear motor) 79, which is a moving magnet type motor that can finely drive the reticle stage RST in the X direction.

The result is that the reticle stage RST of the present embodiment of FIG. 2 is a guideless stage supported such that it can relatively displace with respect to the frame member 18 with three degrees of freedom in the X direction, Y direction and the θz direction. Since the reticle stage RST is driven relatively with respect to the frame member 18, a 5-axis drive device is installed, which includes Y-axis linear motors 76A, 78A, 76B, 78B of the four axes that generate thrust in the Y direction and an X-axis voice coil motor 79 of one axis that generates thrust in the X direction.

According to the present embodiment, moving pieces 60A, 60B, 60C that include a magnet unit that forms the magnetic field in the Z direction, as shown in FIG. 3, are also installed on the side face in the +X direction and the side face in the +Y direction of the frame member 18. Stators 62A, 62B that include coils through which current flows in the Y direction and stator 62C that includes coil through which current flows in the X direction are provided in the reticle base 16 via support stands 64A, 64B, 64C corresponding to the move pieces 60A, 60B, 60C. That is, trim motors for drive in the X direction are each formed from moving magnet type voice coil motor, by moving piece 60A and stator 62A, and moving piece 60B and stator 62B respectively. Also, the trim motor for drive in Y direction is formed from moving magnet type voice coil motor, by moving piece 60C and stator 62C. By using these three trim motors, the frame member 18 can be driven with three degrees of freedom in the X direction, the Y direction, and the θz direction with respect to the reticle base 16.

As mentioned above, when driving the reticle stage RST in the X direction, the Y direction, and the θz direction, the frame member 18 moves slightly so as to cancel out its action, and so the position of the frame member 18 in the XY plane may gradually shift. By using trim motors formed by the moving pieces 60A to 60C and the stators 62A to 62C, the position of the frame member 18 can be returned to the center periodically, for example, and the offset of the position of the frame member 18 with respect to the reticle base 16 can be prevented.

A depression part 18*a* is formed at almost the center of the side wall on the side of the X direction of the frame member 18, as shown in FIG. 3. A rectangular opening 18*b* is formed in this depression part 18*a* for linking the internal and external parts of the frame member 18. Also, rectangular opening 18*c* is formed in the side wall on the Y side of the frame member 18 for linking the internal and external part of the frame member 18. As shown in FIG. 5, all X-axis laser interferometer 69X is installed on the outside of the rectangular opening 18*b* facing the reflecting surface 124*m* of the mirror 24B of the reticle stage RST. A length measurement beam from the X-axis laser interferometer 69X is projected on the reflecting surface 124*m* of the mirror 24B via the rectangular opening 18*b*, and its reflected light returns within the X-axis laser interferometer 69X via the rectangular opening 18*b*. In this case, the position in the Z direction of the light path of the length measurement beam coincides with the position of the neutral surface CT, and the position of the neutral surface CT coincides with the pattern face (reticle face) of the reticle R.

Also, as shown in FIG. 5 fixed mirror Mrx is installed near the upper end of the lens barrel of the projection optical system PL via the fitting member 92. The reference beam from the X-axis laser interferometer 69X is projected on the fixed mirror Mrx via the through hole (light path) 71 formed on the reticle base 16, and its reflected light returns inside the X-axis laser interferometer 69X. The X-axis laser interferometer 69X combines the reflected light of the length measurement beam and the reflected light of the reference beam with the light in the same polarizing direction and the same axis using the internal optical system, and receives interference light of both reflected light beams using the internal detector. Based on the detection signal of the detector, the X-axis laser interferometer 69X always detects the position of the reticle stage body 22 in the X direction at a resolution of approximately 0.5 to 1 nm, for instance, taking the fixed mirror Mrx as the reference. It also detects the speed (normally about 0) in the X direction of the reticle stage body 22 from the difference in positions in the X direction.

On the other hand, the Y-axis laser interferometers 69YA, 69YB are installed on the outside (on the side of the Y direction) of the rectangular opening 18c, as shown in FIG. 6, which is the YZ cross section view near the reticle stage apparatus 12 of FIG. 1, facing the reflecting surfaces of the retro-reflectors 32A, 32B installed in the reticle stage body 22. The length measurement beam from each of the Y-axis laser interferometers 69YA, 69YB is projected on the reflecting surface of the retro-reflectors 32A, 32B via the rectangular opening 18c, and each of the reflected light beams returns within each of Y-axis laser interferometers 69YA, 69YB, via the window glass g2. In this case, the position of the illumination point of the length measurement beam coincides nearly with the position of the neutral surface CT (reticle surface).

Also, as shown in FIG. 6, fixed mirror Mry is installed near the upper end of the lens barrel of the projection optical system PL via the fitting member 93. The reference beam from each of the Y-axis laser interferometers 69YA, 69YB is projected on the fixed mirror Mry via the through hole (light path) 72 formed on the reticle base 16, and its reflected light returns inside each of the Y-axis laser interferometers 69YA, 69YB. Similar to the X-axis laser interferometer 69X mentioned above, each of the Y-axis laser interferometers 69YA, 69YB always detects the position in the Y direction of the reticle stage body 22 in the projected position (position of reflecting surface of retro-reflectors 32A, 32B) of each length measurement beam at a resolution of approximately 0.5 to 1 mm, for example, taking the fixed mirror Mry as reference, based on the interference light between the reflected light of the length measurement beam and the reflected light of the reference beam. In this case, the rotation around the Z axis of the reticle stage RST can also be detected by the pair of Y-axis laser interferometers 69YA, 69YB. Also, the speed in the Y direction of the reticle stage body 22 is detected from the difference in the positions in the Y direction.

In the present embodiment, as mentioned earlier, the position in the Z direction of the light path of the length measurement beam of the X-axis laser interferometer 69X coincides with the position of the neutral surface CT (reticle surface). Therefore, the so-called "Abbe error" does not occur, and the position of the reticle stage RST (reticle R) in the X direction can be measured with good precision. Even in the pair of the Y-axis laser interferometers 69YA, 69YB, the so-called Abbe error does not occur because of similar reasons, and high measurement precision can be obtained.

Three of the moving mirrors mentioned above, that is, the mirror 24B, and the retro-reflectors 32A, 32B are illustrated as moving mirrors Mm in FIG. 1. The X-axis laser interferometer 69X and the pair of Y-axis laser interferometers 69YA, 69YB are illustrated as the reticle interferometer 69 in FIG. 1. Also, the fixed mirrors (fixed mirrors Mrx, Mry) of FIG. 5 and FIG. 6 are not shown in FIG. 1.

In the explanations below, the position of the reticle stage RST in the XY plane (including θz rotation) is assumed to be measured by the reticle interferometer 69. The position data (speed data also OK) of the reticle stage RST is sent from the reticle interferometer 69 to the stage control system 90 and therethrough to the main control device 70. The stage control system 90 controls the driving of the reticle stage RST based on the position data of the reticle stage RST, according to the instructions from the main control device 70.

Returning to FIG. 1, a reducing system with a projection factor of say ¼ or ⅕, telecentric on both sides and formed by dioptric system or catadioptric system is used as the projection optical system PL. The reduced image via the projection optical system PL of the pattern in the illumination area IAR of the reticle R, is transferred on to the slender exposure area IA on the resin layer of one of the shot regions on the wafer W disposed on the image face of the projection optical system, based on the exposure light IL during scanning exposure. The wafer W used as the substrate to be exposed, is a substrate in circular shape of diameter say 150 to 300 mm of semiconductor (silicon and the like) or silicon on insulator (SOI).

The projection optical system PL is held by supporting members (not shown in the figures) via the flange FLG installed in the lens barrel.

Next the wafer stage WST is disposed in the wafer chamber 80. The wafer chamber 80 is covered by a wall 73 wherein a circular opening 71a is formed through which the lower end of the projection optical system PL passes at substantially the center of the ceiling. This wall 73 is formed from a low-degassing material such as stainless steel (SUS).

A wafer base BS made of a table is supported substantially horizontally via multiple vibration preventing units 86 in the wafer chamber 80. The wafer stage WST has a wafer holder 25 that holds the W by vacuum chucking and the like, and is driven in the two dimensional direction (XY) along the upper face of the wafer base BS by the wafer drive system (not shown in the figures) including a linear motor, for example.

A light transmitting window 185 is provided in the side wall on the Y direction side of the wall 73 of the wafer chamber 80. Similarly, a light transmitting window, although not shown in the figures, is provided on the side wall in the +X direction side of the wall 73. A Y-axis moving mirror 56Y made of a plane mirror, extends in the X direction from the end of the wafer holder 25 on the Y direction side. Similarly, an X-axis moving mirror made of a plane minor, although not shown in the figures, extends in the +X direction side from the end of the wafer holder 25.

The length measurement beams from the Y-axis laser interferometer 57Y and the X-axis laser interferometer (not shown in the figures) outside the wafer chamber 80 are irradiated on the Y-axis moving mirror 56Y and the X-axis moving mirror (not shown in the figures) via the light transmitting window 185 and the transmitting window (not shown in the figures). The Y-axis laser interferometer 57Y and the X-axis laser interferometer measure the position of the moving mirror and the angle of rotation each corresponding to, for example, the internal reference mirror as the reference; that is, they measure the position of the wafer W in the X direction and the Y direction, and the angle of rotation about the X axis, the Y axis and the Z axis. The measurement values of the Y-axis laser interferometer 57Y and the X-axis laser interferometer, are fed to the stage control system 90 and the main control device 70. The stage control system 90 controls the position and speed of the wafer stage WST via the drive system (not shown in the figures), based on the measurement values and the control data from the main control device 70.

Next the flow of basic exposure operation by the projection exposure apparatus 10, configured as mentioned above, is described here in a simple manner.

First reticle loading and wafer loading are performed under the control of the main control device 70, by the reticle loader and the wafer loader (not shown in the figures). Next, reticle alignment and wafer alignment are performed using the reticle alignment system, a reference mark plate on the wafer stage WST, an off-axis alignment detection system (all not shown in the figures) and the like. Then, the wafer stage WST is first moved such that the position of the wafer W comes at the scanning start position for exposure of the first shot region (first shot) on the wafer W. At the same time, the reticle stage RST is moved such that the position of the reticle R comes at the scanning start position. With the instructions from the main control device 70, and based on the position data of reticle R measured by the reticle interferometer 69 and the position data of wafer W measured by the Y-axis laser interferometer 57Y and the X-axis laser interferometer on the wafer side, the stage control system 90 synchronously moves the reticle R (reticle stage RST) and the wafer W (wafer stage WST) in the Y direction (scanning direction) and irradiates the exposure light IL, thereby performing scanning exposure of the first shot.

Next, after the wafer stage WST moves by a step equivalent to the one-shot region only in the Y direction or the non-scanning direction (X direction), scanning exposure of the next shot region is performed. In this way, step movement between shots and scanning exposure are sequentially repeated, and the pattern of reticle R is transferred to each shot region on the wafer W.

During movement in the Y direction of the reticle stage RST, the offset in position in the X direction of the reticle stage RST is measured and monitored by the X-axis laser interferometer 69X. The stage control system 90 drives the X-axis voice coil motor 79 so as to cancel this offset in position.

When the X-axis voice coil motor 79 is driven, heat is generated by current passing through the coil body 144 of the stator units 140A, 140B, but the generated heat is recovered by heat exchange with the coolant flowing through the flow passage 142a in the frame 142. At this stage, since the coil unit 141 is covered by the waterproofing layer 150, the coolant (pure water) can be prevented from reaching the mold layer 143, which is made of epoxy resin with inferior water resistance. Accordingly, the coolant is prevented from reaching the coil body 144 from the mold layer 143 and thus insulation defects are prevented.

The forming temperature of polyurethane that forms the waterproofing layer 150 is approximately 200° C., but since the heat-resistant temperature of high heat-resistant epoxy resin that forms the mold layer 143, is greater than 300° C., the mold layer is not adversely affected when forming the waterproofing layer 150.

Moreover, even if the fusing layer of the coil body 144 dissolves during the formation of the waterproofing layer 150 and the adherence effect with the coil is lost the coil itself is retained in shape by the mold layer 143; thus, the error in the thrust coefficient when current flows is inhibited.

Consequently, according to the present invention, active coolant with high heat absorption characteristics can be used while maintaining the electric insulating properties; even when the motor is driven with high the rise in the surface temperature of the stator units 140A, 140B can be inhibited. For this reason, according to the present embodiment, measurement errors in the reticle interferometer (laser interferometer) 69 and thermal deformation of surrounding members and devices can be prevented.

Second Embodiment

Figure 8A:
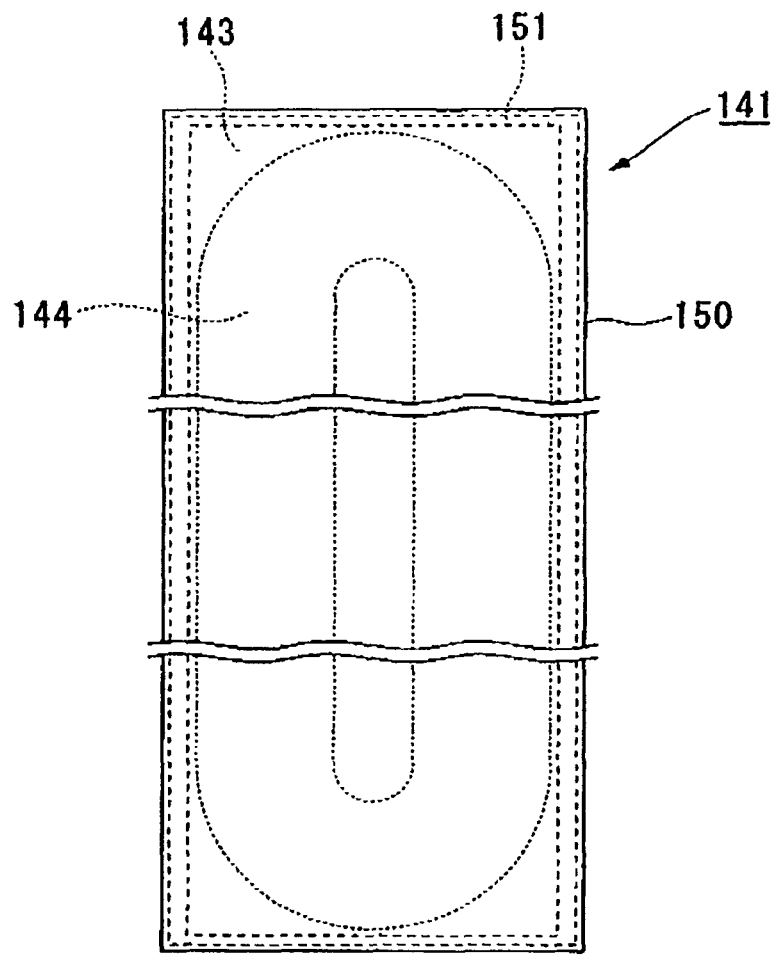
FIG. 8A is the plan view of the coil unit related to the second embodiment.
Figure 8B:
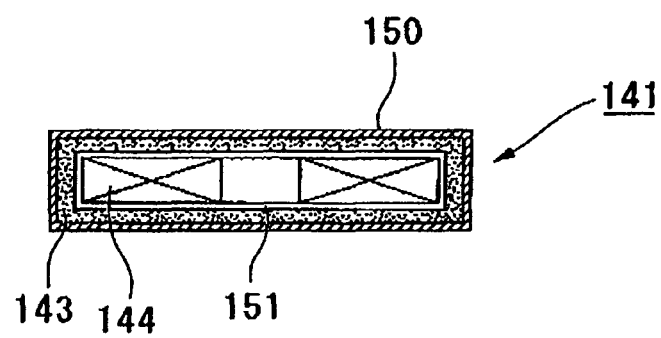
FIG. 8B is a front cross section view of the coil unit related to the second embodiment.
Figure 9:
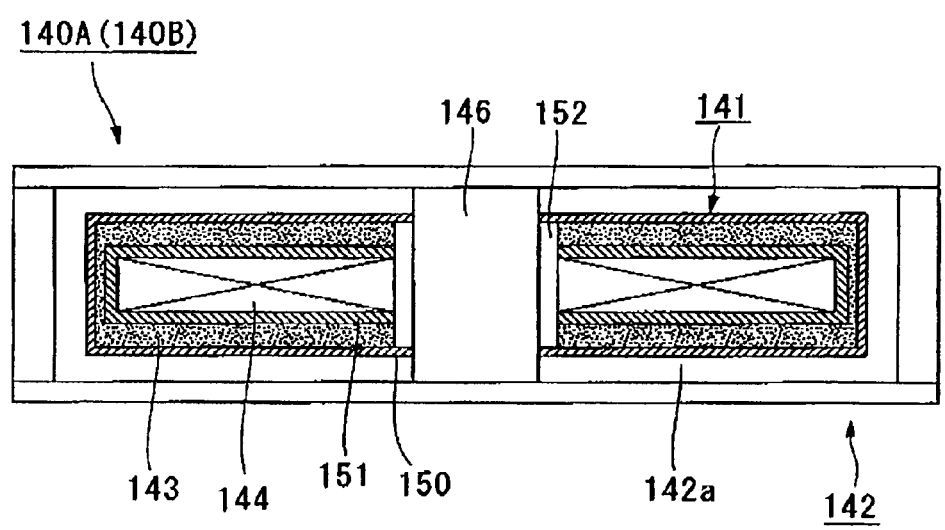
FIG. 9 is a cross section view of the coil unit related to the third embodiment.

Next the second embodiment of the linear motor related to the present invention is described hereafter referring to FIG. 8A and FIG. 8B. Elements in these figures, which are the same as the elements forming the first embodiment shown in FIG. 7A and FIG. 7B, are affixed the same reference numerals and their explanations are omitted.

In FIG. 8A and FIG. 8B, the illustration of frame 142 is omitted and only the coil unit 141 is illustrated. Also, for the sake of convenience, the coil unit 141 shown in FIG. 8A and FIG. 8B is illustrated in the form of a rectangular cross section after omitting the flange.

FIG. 8A is a plan view of the coil unit 141, while FIG. 8B is a front cross section view.

The coil unit 141 of the present embodiment has a coil body 144 that is covered by cylindrical thin plating 151. This thin plating 151 is formed by very thin (for example, a thickness of 0.1 mm) glass epoxy resin with no pinholes in the shape of a rectangular cross section frame open at two ends. As shown in FIG. 8A, it is longer in the length direction than the coil body 144. The coil body 144 is inserted from the opening at one end of the thin plating 151, and is housed in the thin plating 151 in the engaged condition.

According to the present embodiment, the mold layer 143 is formed to cover the thin plating 151, and the mold layer related to the present invention is formed by the thin plating 151 and the mold layer 143. In this case, the mold layer 143 should also be formed of the same material as the thin plating 151, that is, of glass epoxy resin because this material enhances adhesion. The mold layer 143 is covered by the waterproofing layer 150 formed by polyurethane resin.

According to the present embodiment, in addition to obtaining similar action and effect as in the first embodiment mentioned above, even if a pinhole, occurs in the mold layer 143 during its formation, and even if coolant penetrates via this pinhole, contact between the coolant and the coil body 144 can be blocked by the thin plating 151, and the electric insulating properties of the coil body 144 can be ensured. For this reason, in the present embodiment, the formation of pinhole in the mold layer 143 can be permitted, the precision during forming technique can be relaxed, and forming work can be simplified. Also, thinner mold layer 143, and thinner stator units 140A, 140B and thinner linear motor 79 can be realized.

Third Embodiment

Next, the third embodiment of the linear motor related to the present invention is described hereafter referring to FIG.

9. In this figure, elements that are the same in the first embodiment shown in FIG. 7A and FIG. 7B, and in the second embodiment shown in FIG. 8A and FIG. 8B, are affixed the same reference numerals and their explanations are omitted.

The coil unit 141 in the present embodiment is fixed to the same 142 via the core member 146 of the coil body 144. In this case, the entire coil body 144 including the core member 146 cannot be covered by the cylindrical thin plating 151, as in the configuration of the second embodiment. For this reason, only the coil body 144 is covered by the thin plating 151 whereupon the mold layer 143 and the waterproofing layer 150 are formed. However, with this configuration, if the adhesion between the core member 146 and the mold layer 143, or between the core member 146 and the waterproofing layer 150 is not satisfactory, coolant enters through the interface between the core member and the respective layer. Therefore, according to the present embodiment, a layer 152 made of material with high adhesion properties is disposed between at least the core member 146 and the mold layer 143 or the core member 146 and the waterproofing layer 150. According to the present embodiment, layer 152 made of glass epoxy resin is provided on the side face of the core member 146 in contact with the coil body 144 because PPS resin, polyurethane resin and epoxy resin, which form the material of the core member 146, do not possess high adhesion. The coil body 144, after being covered by thin plating 151 made of glass epoxy resin, is molded using the mold layer made of epoxy resin, and then coated on top by the waterproofing layer formed by polyurethane resin. Since the layer 152 made of glass epoxy resin has good adhesion with epoxy resin and polyurethane resin the entry of coolant through the interface with the core member 146 can be prevented. By providing the mold layer 143 separate from the waterproofing layer 150, the coil unit 141 can be formed with high rigidity, and even if a large thrust is applied on the coil body 144 when driving the linear motor, the form of the coil unit can be maintained. Also, since the form of the coil unit 141 is firmly maintained during the assembly of the linear motor, the coil unit 141 can be easily handled, and defects such as cracks or peel-off of the waterproofing layer 150 because of deformation of the coil unit 141 are not likely to occur; thus, the reliability of the linear motor is enhanced.

According to the third embodiment, the waterproofing layer 150, the mold layer 143, and the thin plating 151 were sequentially formed from the outer surface of the coil unit 141, but the present invention is not limited to this sequence; the waterproofing layer 150, the thin plan 151, and the mold layer 143 may be sequentially formed from the outer surface. In this case also, the coolant can be prevented from reaching the coil body 144 by the waterproofing layer 150 and the thin plating 151; and also, the form of the coil unit 141 can be maintained at high rigidity by the mold layer 143. The formation sequence of each of these layers may be decided according to the adhesion between the materials used in the coil body 144, the thin plating 151, the mold layer 143, and the waterproofing layer 150.

The surface of the core member 146 made of PPS resin may be improved by irradiating its surface with ultraviolet light, and its adhesion with polyurethane resin and epoxy resin may be chanced. Moreover, a metallic material (such as titanium) with small relative permeability (preferably between 1.00 to 1.05) and large resistivity may be used as the material of the core member 146. Metallic materials can be easily machined to a high surface precision; thus, the sealability with the waterproofing layer 150 or with the frame 142 can be enhanced.

Fourth Embodiment

Figure 10:
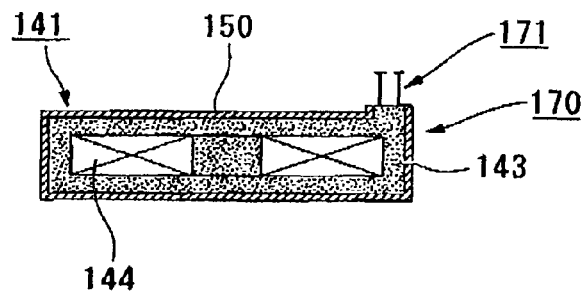
FIG. 10 is a cross section view of the coil unit related to the fourth embodiment.
Figure 11:
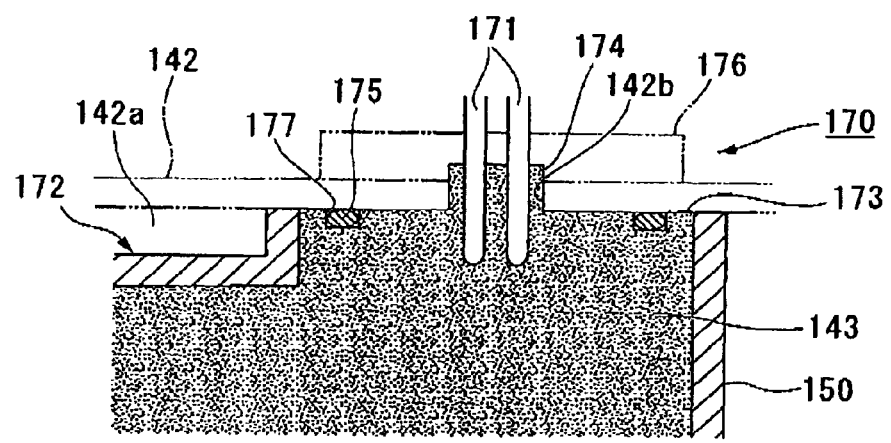
FIG. 11 is an expanded view of the substantial parts of the lead unit in FIG. 10.

Next, the fourth embodiment of the linear motor related to the present invention is described hereafter referring to FIG. 10 and FIG. 11.

In the first to third embodiments mentioned above, the coil unit 141 was disposed considering the flow passage 142a of the coolant; thus, the wiring of the coil body 144 had to be led via the mold layer 143 and the waterproofing layer 150. In the exposure apparatus, cloudiness of the optical member may occur because of the outgas from the member; hence, it is preferable to use a material (such as a fluorine-based material) with the so-called chemical cleaning measures and with little outgas in the exposure apparatus. For this reason, fluorine-based cover is used as the cover for wiring led outside the coil body 144. However, the adhesion of fluorine-based cover with molded material (such as epoxy resin) is poor, and water may enter through the interface of the wiring and the mold layer. Therefore, according to the present embodiment, the lead unit leading the wiring is installed separate from the flow passage of the coolant, and entry of water through the interface of the wiring and the mold layer is prevented.

FIG. 10 is a cross section view of the coil unit 141.

In the coil unit 141 according to the present embodiment, the wiring 171 is lead from the lead unit 170 at one corner to the coil body 144. FIG. 11 is an expanded view of the main parts of the lead unit 170. As shown in FIG. 11, the lead unit 170 is installed so as to protrude from one corner of the coil unit 141, while the mold layer 143 is installed so as to be exposed in the lead unit 170, and it forms a substantially level sealing surface 173 with the end face of the waterproofing layer 150.

A protrusion with wiring 171 disposed in the embedded condition is installed in the sealing, surface 173, and a groove 177 wherein a sealing member 175 such as O-ring is disposed, is formed to surround the protrusion 174.

The frame 142 is joined to the coil unit 141 at the sealing surface 173, and a low passage 142a is formed between it and the coil unit 141. A hole 142b for engaging the protrusion 174 is formed in the frame 142. A waterproofing cover 176 to protect the lead unit of the wiring from the outside is attached to the protrusion 174.

With the configuration mentioned above, in addition to the action and effects similar to those obtained from the first to the third embodiments, the entry of water from the lead unit 170 can be blocked because the lead unit 170 of the wiring 171 is isolated from the coolant flow passage 142a. Especially, in the present embodiment, a sealing member 175 is placed between the sealing surface 173 and the frame 142, between the lead unit 170 and the flow passage 142a. Thus, even if coolant enters from the flow passage 142a between the sealing surface 173 and the frame 142, the coolant can be prevented from reaching the wiring 171, and the electric insulating properties of the coil body 144 against the coolant can be ensured. Also, according to the present embodiment, even if a liquid such as water from outside spills nearby, this liquid can be prevented from entering the coil body 144 through the wiring because a waterproofing cover 176 is provided at the wiring outlet.

In addition to providing a waterproofing cover as a measure against water entry through the wiring outlet, a configuration for insert molding a ferrule-type waterproof holding block or a configuration for inserting molding a sealant may be used. A configuration for insert molding one waterproof terminal in the wiring outlet may also be used. In this case, if the waterproof cap of the waterproof terminal is made of a material having high adhesion with the molded material, entry of water from the interface between the waterproof terminal and the molded material can be prevented, and the wiring connected to this waterproof terminal can be wiring for which chemical cleaning measures can be adopted; thus, the effect of outgas on the optical members can be reduced. The waterproof terminal should preferably satisfy IP57 prescribed in 60529 of the International Electrotechnical Commission (IEC) standards.

The preferred embodiments related to the present invention have been described referring to the attached drawings as above, however, the present invention is not restricted to the examples given. The various shapes of component members or combinations thereof are examples, and various kinds of changes based on design requirements and the like may occur within the scope of the gist of the present invention.

For example, according to the embodiment mentioned above, the waterproofing layer 150 was formed by polyurethane resin, but it is not restricted to this resin; it may be formed (coating) by a resin such as a fluororesin or a silicone resin. Moreover, inorganic waterproof coatings such as glass coating or nickel coating or inorganic oxide coatings (inorganic oxide films) such as titanium oxide ($TiO_2$) or silicon oxide may be used as the waterproofing layer.

Pure water was taken as fluid that becomes the coolant in the embodiments described earlier, however, hydrofluorether or fluorochemical inert fluid may be used instead of pure water. In this case, mold layer using a liquid protection layer made of a material with liquid protection properties may be used as a cover against these fluids.

Also, according to the above-mentioned embodiment, the linear motor of the present invention was used in the stator units 140A, 140B of the X-drive unit 40, but it is not restricted to these units only and may be used in the stator units 136A, 136B, 138A, 138B of the Y-axis drive units 36, 38 also. Furthermore, the linear motor related to the present invention was used in the reticle stage apparatus 12 as a stage apparatus, but it can also be used in the wafer stage WST.

According to the embodiment mentioned above, a linear motor with open magnetic circuit was described wherein one permanent magnet 30 which is a moving piece, was held between two stator units 140A, 140B, which are stators. However, a linear motor with closed magnetic circuit wherein one coil unit is held by two permanent magnets 30, may also be used. If a closed magnetic circuit system is used, the weight of the moving piece increases, but the advantage of reduced magnetic flux leakage can be realized.

Moreover, according to the embodiment mentioned above, the present invention was applied to a moving magnet type linear motor, but it can also be applied to a moving coil type linear motor.

Also, not only a semiconductor wafer for semiconductor devices can be used as the substrate W in the embodiment mentioned above, but also a glass substrate for liquid crystal display devices, a ceramic wage for thin film magnetic heads, or an original wafer (synthetic quartz, silicone wafer) of mask or reticle used in exposure apparatus may be used.

In addition to using the scanning type exposure apparatus based on the step and scan method that scans and projects the pattern of reticle R after synchronously moving the reticle R and substrate W, a projection exposure apparatus based on the step and repeat method that projects the pattern of reticle R with the substrate W and reticle R maintained in the static condition and sequentially moves the substrate W in steps, may also be used as the exposure apparatus 10.

Moreover, the present invention may also be used in a liquid immersion type exposure apparatus that projects a pattern of reticle R on to the substrate W via a specific liquid (for example water).

Moreover, the present invention may also be used in a twin-stage type exposure apparatus. The construction and exposure operations of twin-stage type exposure apparatus are disclosed for example in Japanese Unexamined Patent Applications, First Publication No. H10-163099 and First Publication No. H10-214783 (corresponding to U.S. Pat. No. 6,341,007, No. 6,400,441, No. 6,549,269 and No. 6,590,634), published Japanese translation of the PCT application No. WO 2000-505958 (corresponding to U.S. Pat. No. 5,969,441) or U.S. Pat. No. 6,208,407.

This invention is not limited to only an exposure apparatus for the production of semiconductor device for projecting semiconductor device patterns on wafer, and may be widely used in various kinds of exposure apparatus 10, such as exposure apparatus for production of liquid-crystal display element for projecting liquid-crystal display element patterns on to square glass plates, or expose apparatus for production of thin film magnetic head, image pickup element (CCD) or mask and the like. Furthermore, it may be applied to exposure apparatus for projecting, patterns on wafer W after projection of spot light without using reticle R with the projection optical system PL.

As optical source of illuminating light for exposure, not only bright line generated from an extra-high pressure mercury lamp (g-rays (436 nm), h-rays (404.7 nm), i-rays 365 nm)), KrF excimer laser (248 nm), ArF excimer laser (193 nm), $F_2$ laser (157 nm), but also charged particle beams such as X-rays and electron beams may be used. For example, thermal electron emission type lanthanum hexaboride ($LaB_6$) or tantalum may also be used as the electron gun when electron beam is used. Moreover, when electron beam is used, a configuration with reticle R may be used, or a configuration that forms patterns directly on the wafer without reticle R, may be used. High frequency waves such as YAG laser or semiconductor laser and the like may be used.

In the case of using ultraviolet rays from an excimer laser and the like for the projection optical system PL, a material such as quartz or fluorite may be used that allows ultraviolet rays to pass through, and in case of using $F_2$ laser or X-rays, an optical system such as a catadioptric system or a dioptric system may be used (the reticle R used is also a reflective type reticle), and in the case of using electron beam, an electron optical system made of electron lens and deflector may be used as the optical system. Naturally, the light path through which an electron beam passes must be in a vacuum state. Moreover, the invention can also be applied to a proximity exposure apparatus that projects the pattern of the reticle R after bringing the reticle R and the substrate W into intimate contact, without using the projection optical system PL.

As in the embodiment mentioned above, when a linear motor is used in the substrate stage WST or reticle stage apparatus 12, the invention is not restricted to air-floating type using air bearings but a magnetic floating type using the Lorentz force may also be used. In addition, each stage WST, 12, may be of a type that moves along guides, or may be a guide-less type stage wherein guides are not provided.

The reaction generated by the movement of the substrate stage WST may be configured so as to mechanically escape into the floor (ground) using a frame member, as noted in the Japanese Unexamined Patent Application, First Publication No. H08-166475. Also, the reaction generated by the movement of the reticle stage 12 may be configured so as to mechanically escape into the floor (ground) using a frame member, as noted in the Japanese Unexamined Patent Application, First Publication No. H08-330224.

As described above, the exposure apparatus 10 to which the present invention is applicable, is produced by assembling each of the subsystems that contain each of the constituent features listed in the scope of claims for patent of the present application so as to maintain a predetermined mechanical precision, electrical precision and optical precision. To ensure each of these precisions, adjustments for achieving optical precision for each kind of optical system, adjustments for achieving mechanical precision for each kind of mechanical system, and adjustments for achieving electrical precision for each kind of electrical system are carried out before and after assembly. The process of assembling the exposure apparatus from each subsystem includes mutual mechanical connections, electrical circuit wiring connections, and pneumatic circuit line connections and the like, between the various subsystems. It will be understood, of course, that the steps of assembling the individual subsystems come before the step of assembling the exposure apparatus from the various subsystems. Once the process of assembling the various sub-systems into the exposure apparatus is completed, overall adjustment is performed, so as to achieve the various precisions as an overall exposure apparatus. Further, the exposure apparatus should preferably be produced in a clean room where temperature, cleanliness, and other factors are controlled.

Figure 12:
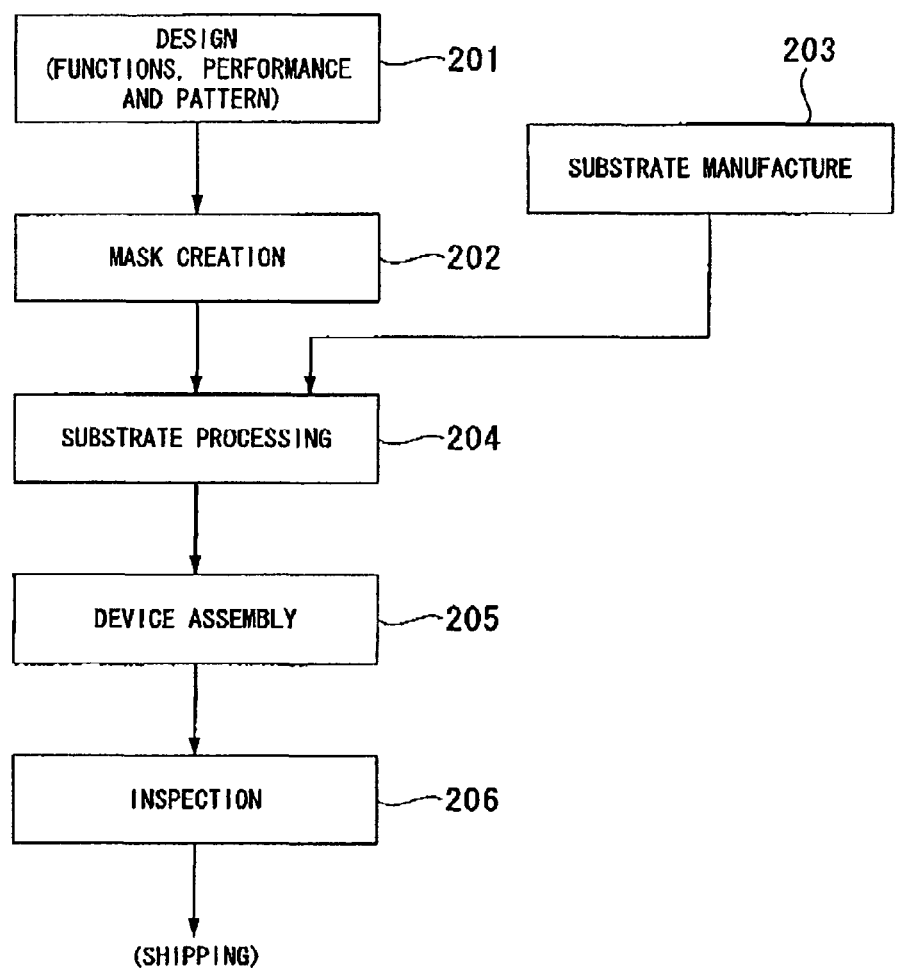
FIG. 12 is a flowchart showing an example of the manufacturing process for a semiconductor device.

As shown in FIG. 12, semiconductor devices are produced by such steps such as step 201 of designing the functions and performance of the device, step 202 of producing a mask (reticle) based on the design step; step 203 of producing a substrate (wafer) of the device material, wafer processing step 204 of projecting the mask pattern on to the substrate (wafer) using the exposure apparatus 10 as described in the embodiment above, step 205 of assembling the device (including dicing, bonding, and packaging steps), and the inspection on step 206.

The invention claimed is:

1. A linear motor comprising:
   a coil unit disposed in a surrounding member and facing a flow passage of a liquid for regulating temperature, and at least a part of a surface of the coil unit being in contact with the liquid, wherein
   the coil unit comprises a coil body, a mold layer that covers the coil body and retains a specific form thereof, and a liquid protection layer that covers the mold layer and is disposed on a surface of the mold layer and has liquid protection properties, and
   a lead unit leading a wiring of the coil body from the coil unit installed separate from the flow passage of the liquid so that the lead unit has no contact with a liquid that flows through the passage, and wherein
   the coil unit has a sealing portion that is in contact with the surrounding member, the wiring extends from the coil unit toward an outside of the surrounding member via the sealing portion, and wherein
   a wiring passing portion through which the wiring passes is provided on the sealing portion, and
   a sealing member is provided at a periphery of the wiring passing portion and between the sealing portion and the surrounding member.

2. The linear motor according to claim 1, wherein the sealing portion and the sealing member are in contact with an inner surface of the surrounding member.

3. The linear motor according to claim 2, wherein the sealing portion is in contact with an inner surface of the surrounding member via no liquid protection layer.

4. The linear motor according to claim 1, wherein the sealing portion is provided on a part of the mold layer.

5. The linear motor according to claim 1, wherein the surrounding member has a wiring output through which the wiring from the lead unit is extracted, the wiring output being waterproofed.

6. The linear motor according to claim 1, wherein a thin plating different from the mold layer is provided between the liquid protection layer and the coil body.

7. The linear motor according to claim 1, wherein the mold layer is formed by epoxy resin, and the liquid protection layer is formed by at least one of polyurethane resin, flouroresin, silicone resin, and an inorganic oxide film.

8. A stage apparatus wherein the linear motor according to claim 1 is used as a drive device.

9. An exposure apparatus that exposes a substrate with a pattern on a mask, wherein the mask has been carried from an outside and has been held on a mask stage apparatus, the substrate has been carried from an outside and has been held on a substrate stage apparatus, and the stage apparatus according to claim 8 is used in at least one of the mask stage apparatus and the substrate stage apparatus.

10. A device fabricating method that comprises a lithographic process, wherein a device pattern is formed on a substrate in the lithographic process using the exposure apparatus according to claim 9.

11. A method for fabricating a linear motor, wherein the linear motor comprises a coil unit disposed in a surrounding member and facing a flow passage of a liquid for regulating temperature, and at least a part of a surface of the coil unit being in contact with the liquid,
    the method comprising:
    providing the coil unit, the coil unit comprising a coil body, a mold layer that covers the coil body and retains a specific form thereof, and a liquid protection layer that covers the mold layer and is disposed on a surface of the mold layer and has liquid protection properties;
    providing a lead unit that leads a wiring of the coil body from the coil unit, the coil unit being installed separate from the flow passage of the liquid so that the lead unit has no contact with a liquid that flows through the passage;
    providing a sealing portion on the coil unit, the coil unit being in contact with the surrounding member, and bringing the wiring from the coil unit to an outside of the surrounding member via the sealing portion; and
    providing a wiring passing portion through which the wiring passes, on the sealing portion, in order to provide a sealing member at a periphery of the wiring passing portion and between the sealing portion and the surrounding member.

12. The method according to claim 11, further comprising:
    arranging the sealing portion and the sealing member to be in contact with an inner surface of the surrounding member.

13. The method according to claim 11, further comprising:
providing the sealing portion on a part of the mold layer.

14. A method for manufacturing a stage apparatus that comprises a mover and a drive apparatus that drives the mover, the method comprising:
providing a linear motor that has been fabricated as the drive apparatus using the method according to claim 11.

15. A method for manufacturing an exposure apparatus that exposes a substrate with a pattern on a mask,
wherein the mask has been carried from an outside and has been held on a mask stage apparatus, the substrate has been carried from an outside and has been held on a substrate stage apparatus,
the method comprising:
manufacturing at least one of the mask stage apparatus and the substrate stage apparatus using the method for manufacturing a stage apparatus according to claim 14.

16. A device fabricating method that comprises a lithographic process, wherein a device pattern is formed on a substrate in the lithographic process using the exposure apparatus that has been manufactured by the manufacturing method according to claim 15.

17. A device fabricating method comprising:
holding a mask with a mask stage apparatus, the mask having been carried from an outside;
holding a substrate with a substrate stage apparatus, the substrate having been carried from an outside;
relatively moving the mask stage apparatus and the substrate stage apparatus; and
irradiating the mask with an exposure light during the relative movement and projecting an image of a pattern formed on the mask onto the substrate,
wherein the mask stage apparatus or the substrate stage apparatus has a linear motor as a drive apparatus for the relative movement, the linear motor having a coil unit, the coil unit disposed in a surrounding member and facing a flow passage of a liquid for regulating temperature, at least a part of a surface of the coil unit being in contact with the liquid,
the coil unit comprises a coil body, a mold layer that covers the coil body and retains a specific form thereof, and a liquid protection layer that covers the mold layer and is disposed on a surface of the mold layer and has liquid protection properties,
a lead unit leading a wiring of the coil body from the coil unit is installed separate from the flow passage of the liquid so that the lead unit has no contact with a liquid that flows through the passage, and wherein
the coil unit has a sealing portion that is in contact with the surrounding member, the wiring extends from the coil unit toward an outside of the surrounding member via the sealing portion, and wherein
a wiring passing portion through which the wiring passes is provided on the sealing portion, and
a sealing member is provided at a periphery of the wiring passing portion and between the sealing portion and the surrounding member.

18. A linear motor comprising:
a coil unit having (a) a coil body, (b) a mold layer that covers the coil body and (c) a liquid protection layer that has liquid protection properties with respect to the liquid and is disposed on a surface of the mold layer;
a surrounding member having an internal space for accommodating the coil unit, while the coil unit is accommodated in the internal space, a flow passage for the liquid being formed between the surrounding member and the liquid protection layer;
a lead portion provided on a part of the coil unit and connected to the surrounding member, the lead portion forming a space, which is isolated from the flow passage, between the part of the coil unit and the surrounding member; and
a wiring connected to the coil body and led out to outside of the surrounding member via the space.

19. The linear motor according to claim 18,
wherein the lead portion has liquid protection properties with respect to the liquid in the flow passage.

20. The linear motor according to claim 18,
wherein the lead portion includes a contact surface contacting with the surrounding member; and
the wiring is led out to outside of the surrounding member via the contact surface.

21. The linear motor according to claim 20,
wherein the lead portion includes a seal member that is disposed so as to surround the wiring at the contact surface.

22. The linear motor according to claim 18,
wherein the mold layer has a tube shaped thin plate body, the thin plate body enfolding the coil body.

23. The linear motor according to claim 22,
wherein the mold layer is formed of the same material as the thin plate body.

24. The linear motor according to claim 18,
wherein the mold layer has a tube shaped thin plate body engaged with the coil body.

25. The linear motor according to claim 18,
wherein a thin plate body is provided between the liquid protection layer and the coil body such that the thin plate body is provided as part of the mold layer.

26. The linear motor according to claim 18,
wherein the liquid is water.

27. The linear motor according to claim 18,
wherein the mold layer is formed of epoxy resin.

28. The linear motor according to claim 18,
wherein the liquid protection layer is formed of an inorganic oxide film.

29. A stage apparatus wherein the linear motor of claim 18 is used as a drive device.

30. An exposure apparatus arranged to project a pattern of a mask held in a mask stage onto a substrate held in the substrate stage, wherein the stage apparatus of claim 29 is used at least in one of the mask stage or the substrate stage.

31. A device fabricating method that comprises a lithographic process, wherein a device pattern is formed on a substrate in the lithographic process using the exposure apparatus of claim 30.

32. A method for fabricating a linear motor, the method comprising:
providing a coil unit that has (a) a coil body, (b) a mold layer that covers the coil body and (c) a liquid protection layer, that has liquid protection properties with respect to liquid and that is disposed on a surface of the mold layer;
disposing the coil unit in a surrounding member;
forming a flow passage for the liquid between the surrounding member and the liquid protection layer of the coil unit;
providing a lead portion on a part of the coil unit and connected to the surrounding member, the lead portion forming a space, which is isolated from the flow passage, between the part of the coil unit and the surrounding member; and providing a wiring leading out from the coil body to outside of the surrounding member via the space.

33. The method according to claim 32, further comprising:
providing a contact surface on the lead portion, such that the contact surface is in contact with the surrounding member; and
leading out the wiring to outside of the surrounding member via the contact surface.

34. The method according to claim 33, wherein:
the contact surface is provided at a part of the mold layer.

35. A method for manufacturing a stage apparatus that comprises a mover and a drive apparatus that drives the mover, the method comprising:
providing a linear motor that has been fabricated as the drive apparatus using the method of claim 32.

36. A method for manufacturing an exposure apparatus that is arranged to expose a substrate with a pattern of a mask,
wherein the mask has been carried from an outside and has been held on a mask stage apparatus, the substrate has been carried from an outside and has been held on a substrate stage apparatus,
the method comprising:
manufacturing at least one of the mask stage apparatus and the substrate stage apparatus using the method for manufacturing a stage apparatus of claim 35.

37. A device fabricating method that comprises a lithographic process, wherein a device pattern is formed on a substrate in the lithographic process using the exposure apparatus that has been manufactured by the manufacturing method of claim 36.

38. A linear motor comprising:
a coil unit disposed in and surrounded by a surrounding member and facing a flow passage of a liquid regulating temperature, and at least a part of a surface of the coil unit being in contact with the liquid, wherein
the coil unit comprises a coil body, a mold layer that covers the coil body and a liquid protection layer that covers the mold layer and is disposed on a surface of the mold layer and has liquid protection properties,
a part of the coil unit is separated from the flow passage such that there is no contact with a liquid that flows through the flow passage, and a surface of the part of the coil unit is in contact with the surrounding member,
a wiring passing portion through which a wiring of the coil body passes and extends toward an outside of the surrounding member, is provided on the surface of the part of the coil unit, and
a sealing member is provided around a periphery of the wiring passing portion between the part of the coil unit and the surrounding member and in contact with the part of the coil unit and the surrounding member.

39. The linear motor according to claim 38, wherein
the part of the coil unit and the sealing member are in contact with an inner surface of the surrounding member.

40. The linear motor according to claim 39, wherein
the part of the coil unit in contact with an inner surface of the surrounding member is in such contact without the presence of the liquid protection layer.

41. The linear motor according to claim 38, wherein
the part of the coil unit comprises a part of the mold layer.

42. The linear motor according to claim 38, wherein
the surrounding member has a wiring output through which the wiring of the coil body is extended, the wiring output being waterproofed.

43. The linear motor according to claim 38, wherein
the mold layer retains a specific form thereof.

44. The linear motor according to claim 38, wherein
the part of the coil unit forms a lead unit that leads the wiring of the coil body from the coil unit.

45. The linear motor according to claim 38, wherein
a thin plating different from the mold layer is provided between the liquid protection layer and the coil body.

46. The linear motor according to claim 38, wherein
the mold layer is formed by epoxy resin, and
the liquid protection layer is formed by at least one of polyurethane resin, fluororesin, silicone resin, and an inorganic oxide film.

47. A stage apparatus wherein the linear motor according to claim 38 is used as a drive device.

48. An exposure apparatus that exposes a substrate with a pattern on a mask, wherein
the mask has been carried from an outside and has been held on a mask stage apparatus,
the substrate has been carried from an outside and has been held on a substrate stage apparatus, and
the linear motor according to claim 38 is used in at least one of the mask stage apparatus and the substrate stage apparatus.

49. A device fabricating method that comprises a lithographic process, wherein a device pattern is formed on a substrate in the lithographic process using the exposure apparatus according to claim 48.

50. A method for fabricating a linear motor,
wherein the linear motor comprises a coil unit disposed in and surrounded by a surrounding member and facing a flow passage of a liquid for regulating temperature, and at least a part of a surface of the coil unit being in contact with the liquid,
the method comprising:
providing the coil unit, the coil unit comprising a coil body, a mold layer that covers the coil body, and a liquid protection layer that covers the mold layer and is disposed on a surface of the mold layer and has liquid protection properties;
separating a part of the coil unit from the flow passage so that the part of the coil unit has no contact with a liquid that flows through the passage;
contacting a surface of the part of the coil unit with the surrounding member;
providing a wiring passing portion through which a wiring of the coil body passes, on a surface of the part of the coil unit; and
providing a sealing member around a periphery of the wiring passing portion and between the part of the coil unit and the surrounding member and in contact with the part of the coil unit and the surrounding member.

51. The method according to claim 50, further comprising:
arranging the part of the coil unit and the sealing member to be in contact with an inner surface of the surrounding member.

52. The method according to claim 50, wherein
the part of the coil unit comprises a part of the mold layer.

53. The method according to claim 50, wherein
the mold layer retains a specific form thereof.

54. The method according to claim 50, wherein
the part of the coil unit forms a lead unit that leads the wiring of the coil body from the coil unit.

55. A method for manufacturing a stage apparatus that comprises a mover and a drive apparatus that drives the mover, the method comprising:

providing a linear motor that has been fabricated as the drive apparatus using the method according to claim 50.

56. A method for manufacturing an exposure apparatus that exposes a substrate with a pattern on a mask,
wherein the mask has been carried from an outside and has been held on a mask stage apparatus, and the substrate has been carried from an outside and has been held on a substrate stage apparatus,
the method comprising:
manufacturing at least one of the mask stage apparatus and the substrate stage apparatus using the method for fabricating a linear motor according to claim 50.

57. A device fabricating method that comprises a lithographic process, wherein a device pattern is formed on a substrate in the lithographic process using the exposure apparatus that has been manufactured by the manufacturing method according to claim 56.

\* \* \* \* \*